US009934986B2

(12) United States Patent
Shim et al.

(10) Patent No.: US 9,934,986 B2
(45) Date of Patent: Apr. 3, 2018

(54) METHOD OF FORMING FINE PATTERNS

(71) Applicant: Samsung Electronics Co., Ltd., Suwon-si, Gyeonggi-do (KR)

(72) Inventors: Jeong-seop Shim, Seoul (KR); Seok-han Park, Hwaseong-si (KR); Bum-seok Seo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/049,268

(22) Filed: Feb. 22, 2016

(65) Prior Publication Data

US 2016/0314987 A1 Oct. 27, 2016

(30) Foreign Application Priority Data

Apr. 23, 2015 (KR) ........................ 10-2015-0057540

(51) Int. Cl.
H01L 21/331 (2006.01)
H01L 21/311 (2006.01)
H01L 21/3213 (2006.01)
H01L 21/033 (2006.01)

(52) U.S. Cl.
CPC .... H01L 21/31144 (2013.01); H01L 21/0337 (2013.01); H01L 21/32139 (2013.01)

(58) Field of Classification Search
CPC ................................................ H01L 21/31144
See application file for complete search history.

(56) References Cited

U.S. PATENT DOCUMENTS

| 8,114,301 | B2 | 2/2012 | Millward et al. |
| 8,398,868 | B2 | 3/2013 | Cheng et al. |
| 8,481,429 | B2 | 7/2013 | Kim et al. |
| 8,853,085 | B1 | 10/2014 | Abdallah et al. |
| 8,859,433 | B2 | 10/2014 | Abdallah et al. |
| 8,865,010 | B2 | 10/2014 | Kihara et al. |
| 8,900,468 | B2 | 12/2014 | Kim et al. |
| 8,946,089 | B2 | 2/2015 | Kim et al. |
| 9,081,274 | B2 * | 7/2015 | Kato ...................... G03F 7/0035 |
| 2012/0127454 | A1 | 5/2012 | Nakamura et al. |
| 2013/0273330 | A1 | 10/2013 | Wang et al. |
| 2014/0127910 | A1 | 5/2014 | Hieno et al. |
| 2014/0315390 | A1 | 10/2014 | Abdallah et al. |
| 2014/0322917 | A1 | 10/2014 | Abdallah et al. |
| 2014/0370712 | A1 | 12/2014 | Kim et al. |
| 2016/0071930 | A1 * | 3/2016 | Bentley ............... H01L 29/0676 257/401 |
| 2016/0244581 | A1 * | 8/2016 | Brink .................. B05D 3/0453 |

FOREIGN PATENT DOCUMENTS

| JP | 5112500 B2 | 1/2013 |
| JP | 2013-201279 A | 10/2013 |
| JP | 5458136 B2 | 4/2014 |

(Continued)

Primary Examiner — Zandra Smith
Assistant Examiner — Andre' C Stevenson
(74) Attorney, Agent, or Firm — Harness, Dickey & Pierce, P.L.C.

(57) ABSTRACT

Provided is a method of forming fine patterns, which is capable of easily forming a plurality of patterns repeatedly with a fine pitch when forming patterns necessary for manufacturing a highly integrated semiconductor device exceeding a resolution limit of a photolithography process.

14 Claims, 40 Drawing Sheets

(56) References Cited

FOREIGN PATENT DOCUMENTS

| JP | 2014-096407 A | 5/2014 |
|----|---------------|--------|
| KR | 10-2012-0126725 | 11/2012 |
| KR | 10-2014-0030873 | 3/2014 |
| KR | 10-2014-0089690 | 7/2014 |
| KR | 10-2014-0144960 | 12/2014 |

* cited by examiner

A - A'

A - A'

A - A'

A - A'

A - A'

A - A'

A - A'

A − A'

METHOD OF FORMING FINE PATTERNS

CROSS-REFERENCE TO RELATED APPLICATION

This application claims the benefit under 35 U.S.C. § 119(a) from Korean Patent Application No. 10-2015-0057540, filed on Apr. 23, 2015, in the Korean Intellectual Property Office, the disclosure of which is incorporated herein in its entirety by reference.

BACKGROUND

The non-limiting example embodiments of the inventive concepts relate to a method of forming fine patterns, and more particularly, to a method of forming fine patterns by using a block copolymer.

As the degree of integration of semiconductor devices has increased, an area occupied by each unit cell has been reduced when seen in a plan view. Therefore, there is a need for a new method of forming patterns, which is capable of adopting a design rule of a critical dimension (CD) of a nano-scale less than several to tens of nanometers so as to cope with the reduction in an area occupied by a unit cell, providing patterns having a nano-scale opening size and improving the CD uniformity of the patterns.

SUMMARY

The non-limiting example embodiment inventive concepts provide a method of forming fine patterns, which is capable of easily forming a plurality of patterns repeatedly with a fine pitch when forming patterns necessary for manufacturing a highly integrated semiconductor device exceeding a resolution limit of a photolithography process.

According to some non-limiting example embodiments, there is provided a method of forming fine patterns, the method including: forming a feature layer on a substrate, the substrate configured to have a first region and a second region; forming a plurality of first pillar-shaped guides and a plurality of second pillar-shaped guides, the plurality of second pillar-shaped guides having a diameter greater than a diameter of the plurality of first pillar-shaped guides, the plurality of first pillar-shaped guides configured to be regularly arranged on the feature layer of the first region of the substrate and the plurality of second pillar-shaped guides configured to be arranged on the feature layer of a boundary between the first region of the substrate and the second region of the substrate; forming a liner on surfaces of at least one of the feature layer, the plurality of first pillar-shaped guides, and the plurality of second pillar-shaped guides; forming a block copolymer layer on the liner, the block copolymer configured to be formed around each of the plurality of first pillar-shaped guides and the plurality of second pillar-shaped guides; forming a plurality of first domains and a second domain by phase-separating the block copolymer layer, the plurality of first domains configured to be regularly arranged together with the plurality of first pillar-shaped guides, and the second domain configured to surround each of the plurality of first domains; removing the plurality of first domains; and forming a plurality of holes in the feature layer by etching the feature layer by using the second domain as an etch mask.

Additionally, in some non-limiting example embodiments of the inventive concepts, distance between the plurality of first pillar-shaped guides and the plurality of second pillar-shaped guides may be shorter than a bulk cycle ($L_0$) of the block copolymer layer, and the hulk cycle ($L_0$) of the block copolymer layer may be in the range of about 40 nanometers (nm) to about 60 nanometers (nm).

Additionally, in some non-limiting example embodiments of the inventive concepts, the plurality of first pillar-shaped guides may be configured to be arranged in a hexagonal array, the hexagonal array configured to have a first pitch that is about 1.73 times greater than a bulk cycle ($L_0$) of the block copolymer layer, and the bulk cycle ($L_0$) of the block copolymer layer may be in the range of about 40 nm to about 60 nm.

Additionally, in some non-limiting example embodiments of the inventive concepts, distance between the plurality of first pillar-shaped guides and the plurality of first domains may be shorter than distance between the plurality of second pillar-shaped guides and the plurality of first domains.

Additionally, in some non-limiting example embodiments of the inventive concepts, distance between center of two adjacent first pillar-shaped guides from among the plurality of first pillar-shaped guides may be substantially same as distance between center of one of the plurality of second pillar-shaped guides and the adjacent first pillar-shaped guide.

Additionally, in some non-limiting example embodiments of the inventive concepts, the plurality of first pillar-shaped guides may be configured to be regularly arranged at a first interval, the plurality of first pillar-shaped guides and the plurality of second pillar-shaped guides may be configured to be regularly arranged at a second interval, and the first interval is configured to be greater than the second interval.

Additionally, in some non-limiting example embodiments of the inventive concepts, the plurality of first pillar-shaped guides may be configured to be regularly arranged to have a first pitch, the plurality of first domains may be configured to be arranged in a cylinder form at a center between two or three plurality of first pillar-shaped guides from among the plurality of first pillar-shaped guides by phase-separating the block copolymer layer, and the plurality of first pillar-shaped guides and the plurality of first domains may be configured to be regularly arranged to have a second pitch less than the first pitch.

Additionally, in some non-limiting example embodiments of the inventive concepts, in the forming of the plurality of first domains and the second domain, the plurality of first domains may not be formed between the plurality of first pillar-shaped guides and the plurality of second pillar-shaped guides.

Additionally, in some non-limiting example embodiments of the inventive concepts, the liner may include a neutral liner.

Additionally, in some non-limiting example embodiments of the inventive concepts, the first region may be configured to include a cell region, and the second region may be configured to include a peripheral circuit region.

According to another non-limiting example embodiments of the inventive concepts, there is provided a method of forming fine patterns, the method including: forming a feature layer on a substrate, the substrate configured to have a first region and a second region; forming a plurality of first holes and a plurality of second holes, the plurality of first holes configured to be regularly arranged at a first interval in the feature layer of the first region of the substrate, and the plurality of second holes configured to be regularly arranged at a second interval in the feature layer of a boundary between the first region of the substrate and the second region of the substrate, the second interval configured to be greater than the first interval; forming a plurality of first pillar-shaped guides and a plurality of second pillar-shaped guides, the plurality of first pillar-shaped guides configured to protrude upward from the feature layer to fill the plurality of first holes, the plurality of second pillar-shaped guides configured to protrude upward from the feature layer to fill the plurality of second holes; forming a neutral liner on surfaces of at least one of the feature layer, the plurality of first pillar-shaped guides, and the plurality of second pillar-shaped guides; forming a block copolymer layer on the neutral liner, the block copolymer configured to be formed around each of the plurality of first pillar-shaped guides and the plurality of second pillar-shaped guides; forming a plurality of first domains and a second domain by phase-separating the block copolymer, the plurality of first domains configured to be regularly arranged together with the plurality of first pillar-shaped guides, and the second domain configured to surround each of the plurality of first pillar-shaped guides and the plurality of first domains; removing the plurality of first domains; and forming a plurality of third holes in the feature layer by etching the neutral liner and the feature layer by using as an etch mask at least one of the plurality of first pillar-shaped guides, the plurality of second pillar-shaped guides, and the second domain.

Additionally, in some non-limiting example embodiments of the inventive concepts, diameter of the plurality of second holes may be configured to be greater than a diameter of the plurality of first holes and a diameter of the plurality of third holes.

Additionally, in some non-limiting example embodiments of the inventive concepts, in forming of the plurality of third holes, the plurality of third holes may not be formed between the plurality of first holes and the plurality of second holes, the plurality of first holes and the plurality of second holes configured to be adjacent to one another.

Additionally, in some non-limiting example embodiments of the inventive concepts, distance between the plurality of first holes and the plurality of second holes may be shorter than distance between the plurality of second holes and the plurality of third holes.

Additionally, in some non-limiting example embodiments of the inventive concepts, the plurality of first holes may be configured to be arranged in a hexagonal array having a first pitch that is about 1.73 times greater than a bulk cycle ($L_0$) of the block copolymer layer, and the bulk cycle ($L_0$) of the block copolymer layer may be in the range of about 40 nm to about 60 nm.

According to another aspect of the non-limiting example embodiments of the inventive concepts, there is provided a method of forming fine patterns, the method including: forming an etching target film on a substrate, the substrate configured to have a first region and a second region; forming a first mask layer on the etching target film; forming a second mask layer on the first mask layer; forming a second mask pattern by patterning the second mask layer, the second mask pattern configured to have a plurality of first openings and a plurality of second openings, the plurality of first openings configured to be regularly arranged in the first region of the substrate, the plurality of second openings configured to be regularly arranged on boundary between the first region of the substrate and the second region of the substrate, the plurality of second openings configured to have a diameter greater than a diameter of the first openings; forming a first mask pattern by etching the first mask layer by using the second mask pattern as an etch mask, the first mask pattern configured to have a plurality of first holes and a plurality of second holes, the plurality of first holes configured to be regularly arranged in the first region, the plurality of second holes configured to be regularly arranged on boundary between the first region of the substrate and the second region of the substrate, the plurality of second holes configured to have a diameter greater than a diameter of the plurality of first holes; forming a plurality of first pillar-shaped guides and a plurality of second pillar-shaped guides, the first pillar-shaped guides configured to protrude from the inside of the plurality of first holes over the first mask pattern, and the plurality of second pillar-shaped guides configured to protrude from the inside of the plurality of second holes over the first mask pattern; removing the second mask pattern to expose an upper surface of the first mask pattern; forming a neutral liner on surfaces of at least one of the feature layer, the plurality of first pillar-shaped guides, and the plurality of second pillar-shaped guides; forming a block copolymer layer on the neutral liner, the block copolymer configured to be formed around each of the plurality of first pillar-shaped guides and the plurality of second pillar-shaped guides; forming a plurality of first domains and a second domain by phase-separating the block copolymer layer, the plurality of first domains configured to be regularly assembled in a position spaced apart from the plurality of first pillar-shaped guides, and the second domain configured to surround each of the plurality of first pillar-shaped guides and the plurality of first domains; removing the plurality of first domains; forming a plurality of third holes in the first mask pattern by etching the first mask pattern by using as an etch mask on at least one of the plurality of first pillar-shaped guides, the plurality of second pillar-shaped guides, and the second domain; and forming a fine pattern by etching the etching target film using as an etch mask on at least one of the first mask pattern, the plurality of second holes, and the plurality of third holes, the first mask pattern including the plurality of first holes.

Additionally, in some non-limiting example embodiments of the inventive concepts, the plurality of third holes may not be formed within a regular interval from a boundary between the first region of the substrate and the second region of the substrate.

Additionally, in some non-limiting example embodiments of the inventive concepts, distance between respective centers of two adjacent first openings among the plurality of first openings may be substantially same as distance between center of one of the plurality of second openings among the plurality of second openings and center of the adjacent first opening.

Additionally, in some non-limiting example embodiments of the inventive concepts, distance between the plurality of first openings and the plurality of second openings may be shorter than a bulk cycle ($L_0$) of the block copolymer layer, and the bulk cycle ($L_0$) of the block copolymer layer may be in the range of about 40 nanometer (nm) to about 60 nanometer (nm).

Additionally, in some non-limiting example embodiments of the inventive concepts, the neutral liner may include an organic material in which affinity for a material of the plurality of first domains is similar to affinity for a material of the second domain.

Additionally, in some non-limiting example embodiments of the inventive concepts, the method for forming patterns comprises heat treating a block copolymer layer to form a first domain region having a first phase and a second domain region having a second phase. The first phase being different from the second phase. The the block copolymer layer being formed between a first-pillar shaped guide and a second-pillar shaped guide on a substrate. Additionally, in some non-limiting example embodiments, the method comprising removing the first domain region of the block copolymer layer by etching using the second domain region of the block copolymer layer as an etch mask.

Additionally, in some non-limiting example embodiments of the inventive concepts, the heat treating the block copolymer layer includes annealing at a temperature higher than a glass temperature of a block copolymer included in the block copolymer layer, In some non-limiting example embodiments of the inventive concepts, the heat treating the block polymer layer includes annealing at a temperature of about 130° C. to about 190° C.

BRIEF DESCRIPTION OF THE DRAWINGS

The foregoing and other features will be apparent from the more particular description of non-limiting example embodiments of the inventive concepts, as illustrated in the accompanying drawings in which like reference characters refer to like parts throughout the different views. The drawings are not necessarily to scale, emphasis instead being placed upon illustrating principals of the inventive concepts. In the drawings.

DETAILED DESCRIPTION OF THE EMBODIMENTS

Figure 1A:
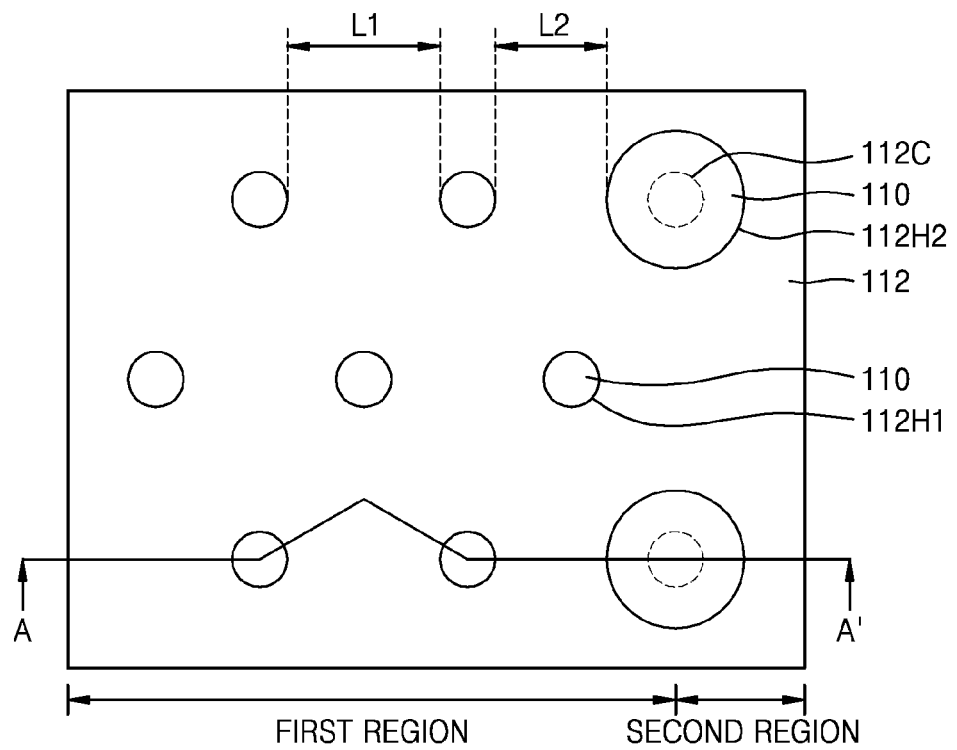
FIGS. 1A, 2A, 3A, 4A, 5A, 6A, 7A, 8A, 9A, 10A, and 11A are plan views for describing a method of forming fine patterns, according to a non-limiting example embodiment of the inventive concepts.

Hereinafter, non-limiting example embodiments of the inventive concepts will be described in detail with reference to the accompanying drawings. Like reference numerals in the drawings denote like elements throughout the specification.

The non-limiting example embodiments of the inventive concepts will now be described more fully with reference to the accompanying drawings, in which non-limiting example embodiments of the inventive concepts are shown. The inventive concepts may, however, be embodied in many different forms and should not be construed as being limited to the non-limiting example embodiments set forth herein; rather, these non-limiting example embodiments are provided so that this disclosure will be thorough and complete, and will fully convey the concept of the inventive concepts to those skilled in the art.

Also, though terms "first," "second," etc., are used to describe various members, components, regions, layers, and/or portions in various non-limiting example embodiments of the inventive concepts, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Unless otherwise defined, all terms used herein, including technical and scientific terms, have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain non-limiting example embodiment is differently implementable, a specific process procedure may be performed in different order described herein. For example, two successively-described processes may be performed at substantially the same time, or may be performed in reverse order.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the accompanying drawings, the modifications of the illustrated shapes may be expected according to manufacturing technologies and/or tolerance. Therefore, the non-limiting example embodiments should not be construed as being limited to specific shapes of the illustrated regions. The shapes may be changed during the manufacturing processes.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein. As used herein, the term "and/or" includes any and all combinations of one or more of the associated listed.

Figure 1B:
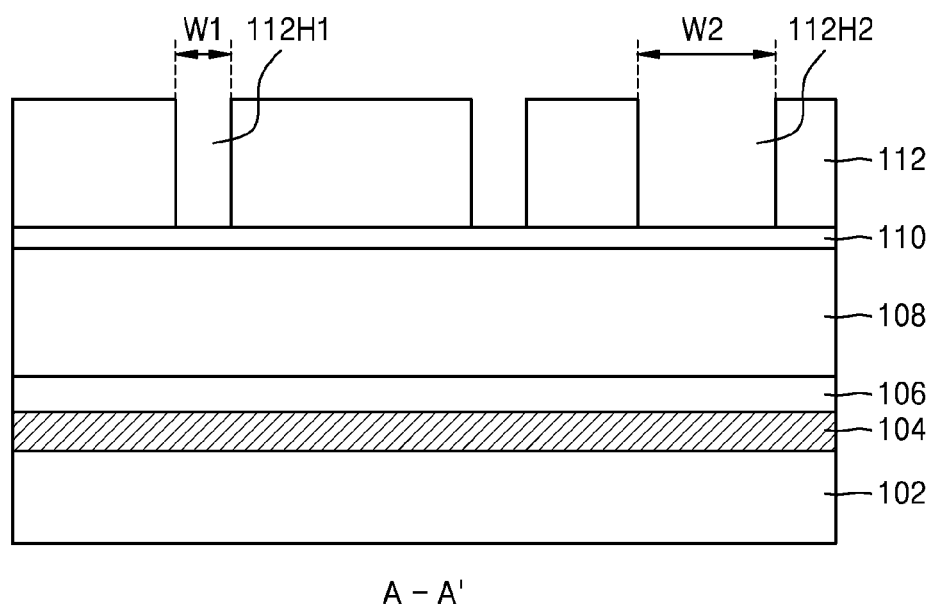
FIGS. 1B, 2B, 3B, 4B, 5B, 6B, 7B, 8B, 9B, 10B, and 11B are cross-sectional views taken along lines A-A' of FIGS. 1A, 2A, 3A, 4A, 5A, 6A, 7A, 8A, 9A, 10A, and 11A, respectively.
Figure 2A:
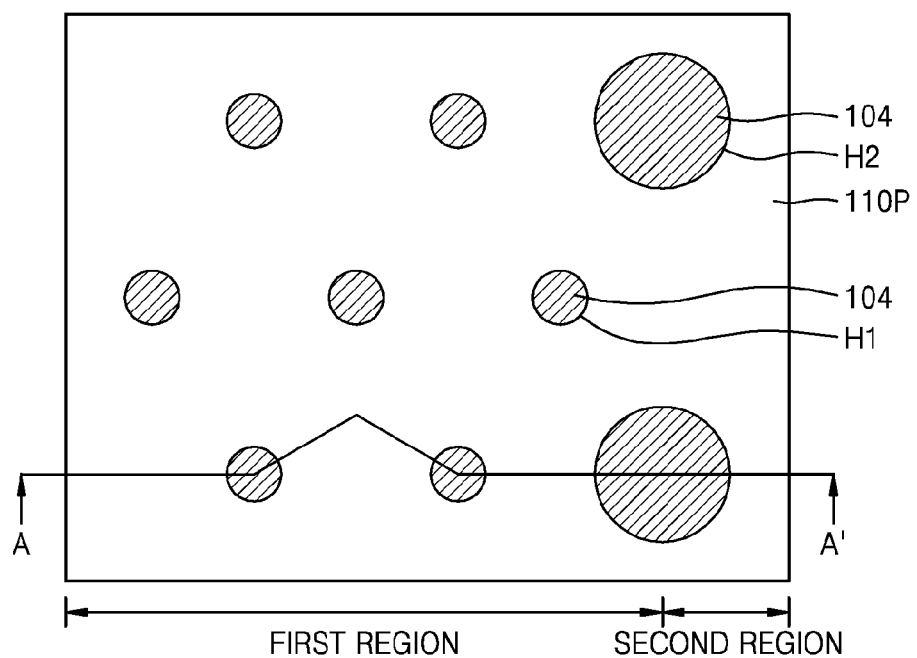
Figure 2B:
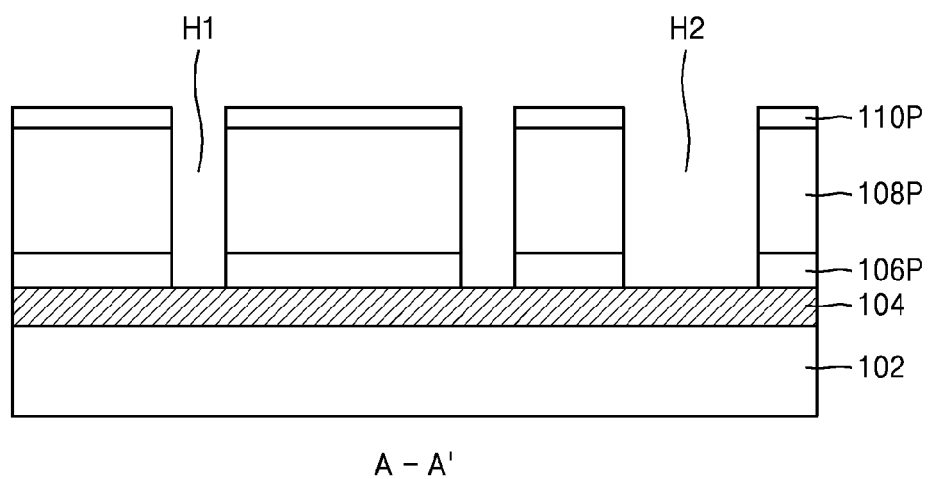

FIGS. 1A, 2A, . . . , and 11A are plan views of a method of forming fine patterns, according to a non-limiting example embodiment of the inventive concepts, and FIGS. 1B, 2B, . . . , and 11B are cross-sectional views taken along lines A-A' of FIGS. 1A, 2A, . . . , and 11A, respectively.

Only some of all fine patterns are illustrated in the drawings for convenience of description, but the inventive concepts is not limited thereto.

Referring to FIGS. 1A and 1B, an etching target film 104 is formed on a substrate 102, and a first mask layer 106 and a second mask layer 108 are sequentially formed on the etching target film 104.

The substrate 102 may be a semiconductor substrate. In some non-limiting example embodiments, the substrate 102 may include a semiconductor such as silicon (Si) or germanium (Ge). In some non-limiting example embodiments, the substrate 102 may include a compound semiconductor such as SiGe, SiC, GaAs, InAs, or InP. In some non-limiting example embodiments, the substrate 102 may have a silicon on insulator (SOI) structure. The substrate 102 may include a conductive region, for example, an impurity-doped well or an impurity-doped structure. In addition, the substrate 102 may have various device isolation structures such as a shallow trench isolation (STI) structure.

The etching target film 104 may be an insulating film or a conductive film. For example, the etching target film 104 may be selected from the group consisting of a metal, an alloy, metal carbide, metal nitride, metal oxynitride, metal oxycarbide, a semiconductor, polysilicon, oxide, nitride, oxynitride, a hydrocarbon compound, and any combinations thereof, but is not limited thereto. When desired final patterns are formed on the substrate 102, the etching target film 104 may be omitted.

The first mask layer 106 may be used as a feature layer to form the desired final patterns in the etching target film 104 and transfer the final patterns to the etching target film 104.

In some non-limiting example embodiments, the first mask layer 106 may include a Si-containing material. For example, the first mask layer 106 may include one selected from the group consisting of a silicon nitride film, a silicon oxide film, a silicon oxynitride film, a silicon carbon nitride film, and any combinations thereof, but is not limited thereto. The first mask layer 106 may be formed to have a thickness of about 100 Å to about 500 Å, but is not limited thereto.

A material of the second mask layer 108 may be different from a material of the first mask layer 106. For example, when the first mask layer 106 includes a silicon nitride film, a silicon oxynitride film, and/or a silicon carbon nitride film, the second mask layer 108 may include one selected from the group consisting of a carbon-containing film, a silicon oxide film, and a combination thereof, such as spin-on hardmask (SOH) materials. The carbon-containing film including the SOH materials may include an organic compound having a relatively high carbon content of about 85 wt % to about 99 wt % with respect to a total weight of the carbon-containing film. The organic compound may include an aromatic hydrocarbon compound having a ring, such as phenyl, benzene, or naphthalene, or a derivative thereof. The second mask layer 108 may be formed to have a thickness of about 500 Å to about 3000 Å, but is not limited thereto.

An anti-reflection film 110 may be formed on the second mask layer 108, and a third mask pattern 112 may be formed on the anti-reflection film 110, the third mask pattern 112 having a plurality of first holes 112H1 and a plurality of second holes 112H2.

As the anti-reflection film 110, any film may be used as long as the film is used in a typical photolithography process. In some non-limiting example embodiments, the anti-reflection film 110 may include a Si-containing material. In some non-limiting example embodiments, the anti-reflection film 110 may include a silicon oxynitride film. In some other non-limiting example embodiments, the anti-reflection film 110 may include an organic anti-reflective coating (ARC) material for a KrF excimer laser, an ArF excimer laser, or any other light sources.

The anti-reflection film 110 may be formed to have a thickness of about 20 nm to about 500 nm, but is not limited thereto.

A width or a critical dimension (CD) of a plurality of first pillar-shaped guides PG1 and a plurality of second pillar-shaped guides PG2 in a subsequent process described with reference to FIGS. 3A and 3B later may be determined by a width W1 of the plurality of first holes 112H1 and a width W2 of the plurality of second holes 112H2 formed in the third mask pattern 112.

The width W2 of the plurality of second holes 112H2 may be greater than the width W1 of the plurality of first holes 112H1.

The plurality of first holes 112H1 formed in the third mask pattern 112 may be arranged in a regular form. For example, the plurality of first holes 112H1 may be arranged in a hexagonal array or a matrix array. In addition, the plurality of first holes 112H1 may be formed in a first region of the substrate 102.

The plurality of second holes 112H2 formed in the third mask pattern 112 may be arranged in a regular form. For example, the plurality of second holes 112H2 may be arranged in a linear array. In addition, the plurality of second holes 112H2 may be formed on a boundary between the first region and a second region.

In some non-limiting example embodiments, the first region may be a cell region and the second region may be a peripheral circuit region. It may be necessary that the cell region has holes formed at regular intervals to divide cells, but it may not be necessary that the peripheral circuit region has holes having fine pitches like the cell region.

Centers 112C of the plurality of second holes 112H2 may be disposed at the same position as those when the plurality of first holes 112H1 are formed at the boundary between the first region and the second region at the same interval.

A shortest distance L1 between the adjacent first holes 112H1 may be greater than a shortest distance L2 between the first hole 112H and the second hole 112H2 because a center distance between the first holes 112H1 is substantially the same as a center distance between the first hole 112H1 and the second hole 112H2, but the width W2 of the second holes 112H2 is greater than the width W1 of the first holes 112H1.

The third mask pattern 112 may include a photoresist. In some non-limiting example embodiments, the third mask pattern 112 may include a resist for a KrF excimer laser (248 nm), a resist for an ArF excimer laser (193 nm), a resist for an F2 excimer laser (157 nm), or a resist for extreme ultraviolet (EUV) light (13.5 nm).

Referring to FIGS. 2A and 2B, a second mask pattern 108P and an anti-reflection pattern 110P may be formed by etching the second mask layer 108 and the anti-reflection film 110 using the third mask pattern 112 (see FIGS. 1A and 1B) as an etch mask, and a first mask pattern 106P may be formed by etching the first mask layer 106 using the second mask pattern 108P as an etch mask, thereby forming a plurality of first guide-forming holes H1 and a plurality of second guide-forming holes H2 passing through the first mask pattern 106P and the second mask pattern 108P.

The plurality of first guide-forming holes H1 may be arranged in a regular form. For example, the first guide-forming holes H1 may be arranged in a hexagonal array or a matrix array. In addition, the first guide-forming holes H1 may be formed in the first region of the substrate 102.

The plurality of second guide-forming holes H2 may be arranged in a regular form. For example, the second plurality of guide-forming holes H2 may be arranged in a linear array. In addition, the second plurality of guide-forming holes H2 may be formed at the boundary between the first region and the second region.

After the plurality of first guide-forming holes H1 and the plurality of second guide-forming holes H2 are formed, unnecessary films may be removed to expose an upper surface of the anti-reflection pattern 110P.

Figure 3A:
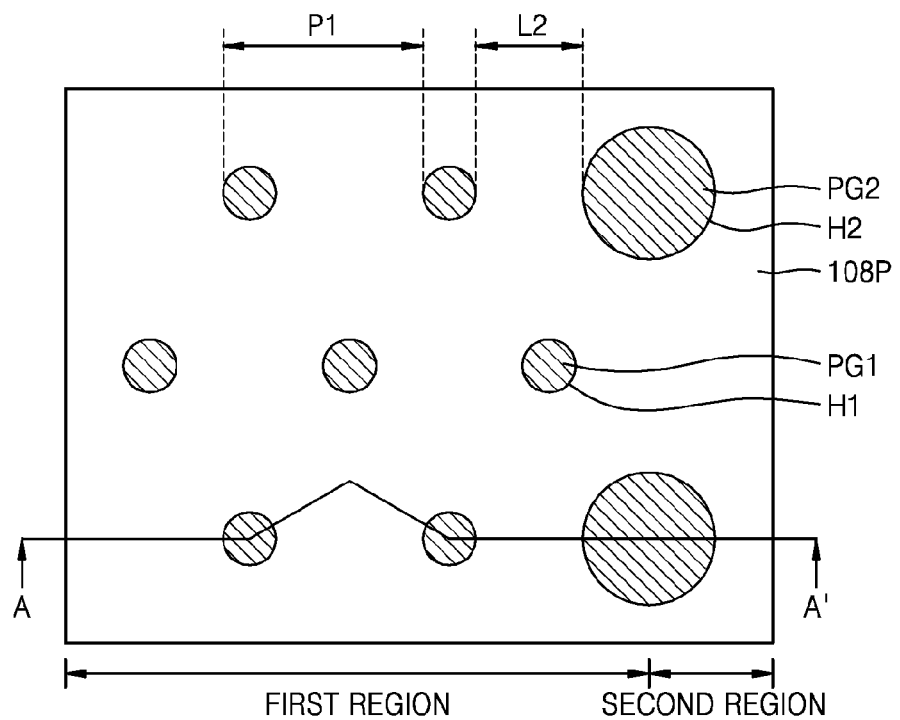
Figure 3B:
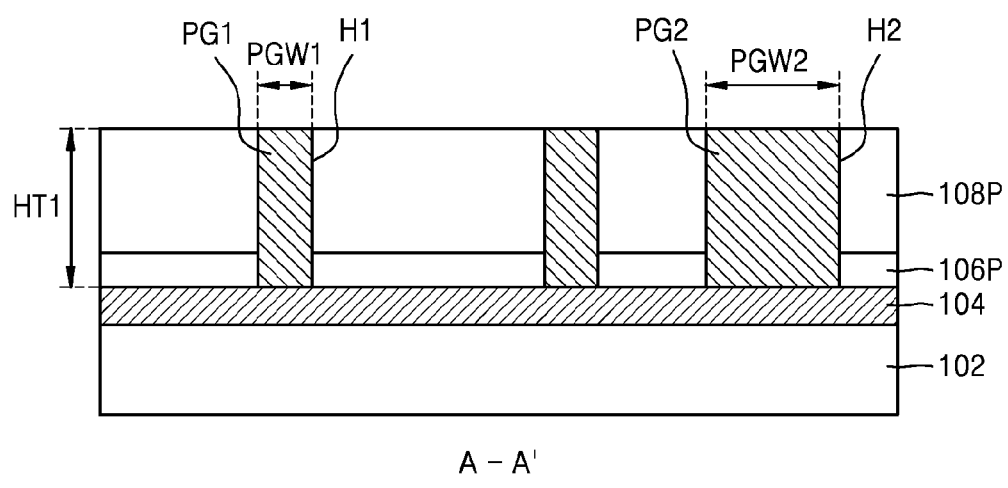

Referring to FIGS. 3A and 3B, a plurality of first pillar-shaped guides PG1 may be respectively formed in the plurality of first guide-forming holes H1, and a plurality of second pillar-shaped guides PG2 may be respectively formed in the plurality of second guide-forming holes H2.

In some non-limiting example embodiments, in order to form the plurality of first pillar-shaped guides PG1 and the plurality of second pillar-shaped guides PG2, a guide-forming material may be deposited to cover inner surfaces of the plurality of first guide-forming holes H1 and the plurality of second guide-forming holes H2 and an upper surface of the anti-reflection pattern 110P, and unnecessary portions of the deposited guide-forming material may be removed through an etch-back process or a polishing process such that the deposited guide-forming material remains only in the plurality of first guide-forming holes H1 and the plurality of second guide-forming holes H2. While the unnecessary portions of the deposited guide-forming material are removed, the anti-reflection pattern 110P is removed at the same time, thereby exposing the upper surface of the second mask pattern 108P around the plurality of first pillar-shaped guides PG1 and the plurality of second pillar-shaped guides PG2.

The plurality of first pillar-shaped guides PG1 and the plurality of second pillar-shaped guides PG2 may have shapes protruding upward from the first mask pattern 106P. The plurality of first pillar-shaped guides PG1 and the plurality of second pillar-shaped guides PG2 protruding upward from the first mask pattern 106P may have a height of about 10 nm to about 500 nm, but are not limited thereto.

A width PGW2 of the plurality of second pillar-shaped guides PG2 may be greater than a width PGW1 of the plurality of first pillar-shaped guides PG1.

The plurality of first pillar-shaped guides PG1 and the plurality of second pillar-shaped guides PG2 may include a Si-containing material containing. In some non-limiting example embodiments, the plurality of first pillar-shaped guides PG1 and the plurality of second pillar-shaped guides PG2 may include silicon oxide. In some non-limiting example embodiments, the plurality of first pillar-shaped guides PG1 and the plurality of second pillar-shaped guides PG2 may be formed through an atomic layer deposition (ALD) process or a chemical vapor deposition (CVD) process.

In some non-limiting example embodiments, the first pillar-shaped guides PG1 may be arranged in a hexagonal array having a first pitch P1 that is about 1.73 times greater than a bulk cycle $L_0$ of a block copolymer layer 202. As will described later with reference to FIGS. 7A and 7B a plurality of first domains 202A formed by phase-separating the block copolymer layer 202 (see FIGS. 6A and 6B) may be self-assembled in a cylinder shape at a center between three adjacent first pillar-shaped guides PG1 among the plurality of first pillar-shaped guides PG1.

In some non-limiting example embodiments, the width PGW2 of the plurality of second pillar-shaped guides PG2 may be formed to have a diameter of about 1.5 times to about 5 times greater than the width PGW1 of the plurality of first pillar-shaped guides PG1. To this end, it is able to adjust the width W2 of the plurality of second holes 112H2 in the third mask pattern 112 described with reference to FIGS. 1A and 1B and a width of the plurality of second guide-forming holes H2 described with reference to FIGS. 2A and 2B.

In some non-limiting example embodiments, the plurality of first pillar-shaped guides PG1 with the first pitch P1 may be regularly arranged and may be arranged in the first region of the substrate 102. The shortest distance L2 between the plurality of first pillar-shaped guides PG1 and the plurality of second pillar-shaped guides PG2 may be shorter than the bulk cycle $L_0$ of the block copolymer layer 202. The self-assembling of the block copolymer layer 202 may be determined by various process parameters. The formation of the block copolymer in a region capable of securing the bulk cycle $L_0$ may minimize free energy due to the self-assembling. Therefore, the shortest distance L2 defined by the plurality of first pillar-shaped guides PG1 and the plurality of second pillar-shaped guides PG2 is an important parameter to self-assemble the block copolymer.

Figure 4A:
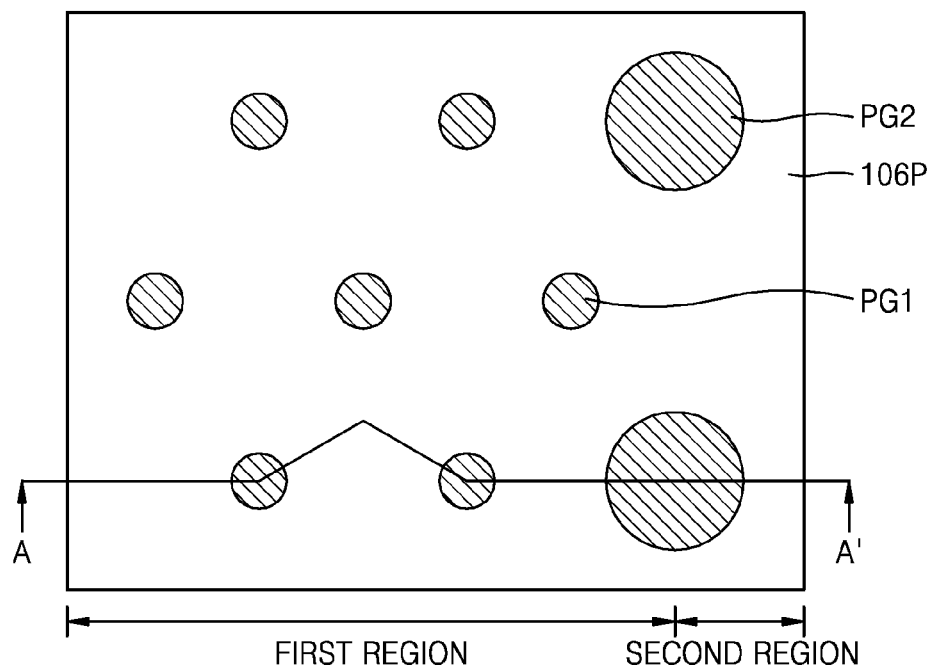
Figure 4B:
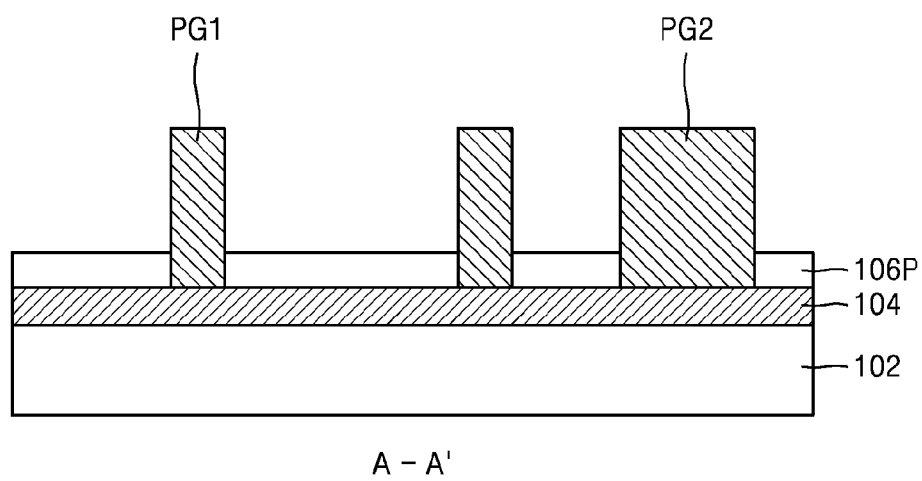

Referring to FIGS. 4A and 4B, the second mask pattern 108P (see FIGS. 3A and 3B) may be removed to expose an upper surface of the first mask pattern 106P and upper surfaces and sidewalls of the first plurality of pillar-shaped guides PG1 and the plurality of second pillar-shaped guides PG2.

In some non-limiting example embodiments, when the second mask pattern 108P includes an SOH material, the second mask pattern 108 may be removed through an ashing and stripping process.

Figure 5A:
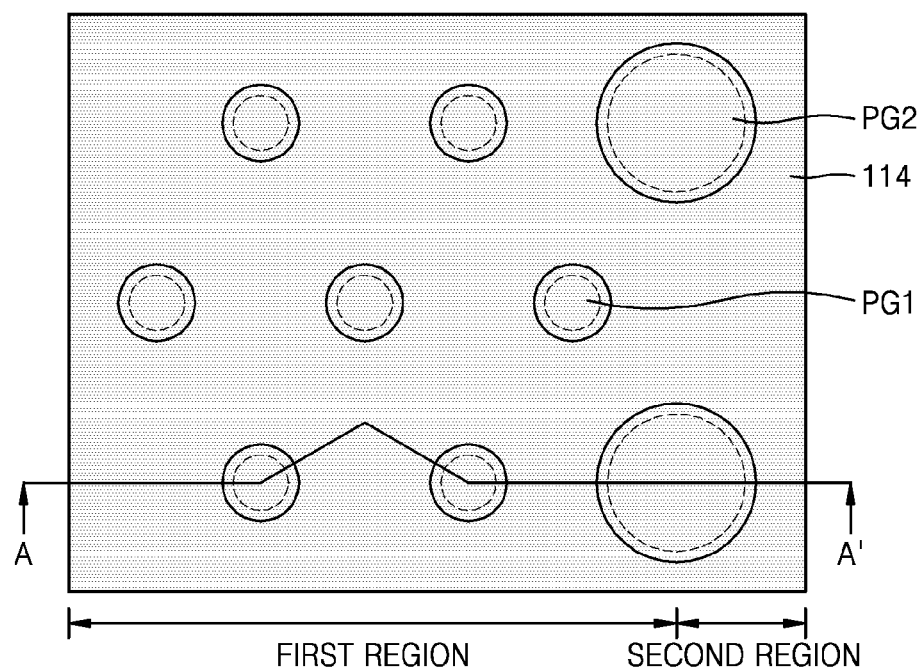
Figure 5B:
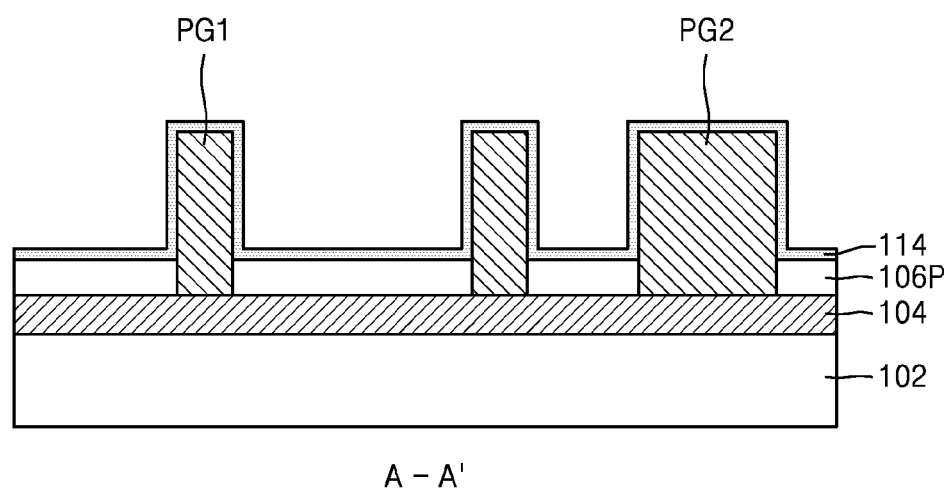

Referring to FIGS. 5A and 5B, a liner 114 may be formed to cover the exposed upper surface of the first mask pattern 106P and the exposed upper surfaces and sidewalls of the plurality of first pillar-shaped guides PG1 and the plurality of second pillar-shaped guides PG2.

The liner 114 may be a neutral liner. When the liner 114 is the neutral liner, the liner 114 may include a neutral organic compound from among constituents of the block copolymer layer 202 to be described below with reference to FIGS. 8A, 8B, 12, and 13, the neutral organic compound, in which affinity for a first polymer block PB1 (see FIG. 12) is similar to affinity for a second polymer block PB2 (see FIG. 12).

Figure 12:
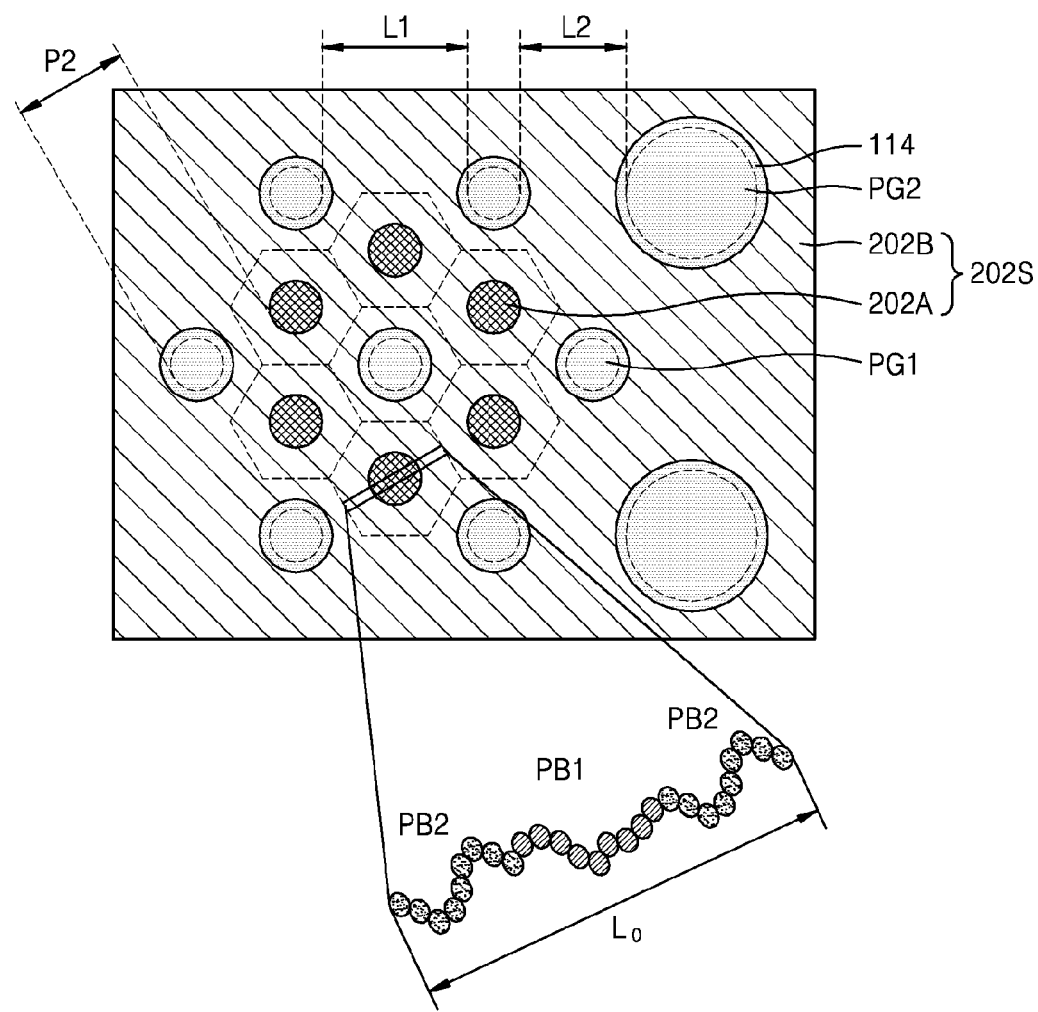
FIG. 12 is a plan view of a first domain and a second domain formed by a method of forming fine patterns, according to a non-limiting example embodiment of the inventive concepts.

In some non-limiting example embodiments, the liner 114 may include a first polymer having the same repeat unit as repeat unit composing the first polymer block PB1 (see FIG. 12) and a second polymer having the same repeat unit as a repeat unit composing the second polymer block PB2 (see FIG. 12).

In some non-limiting example embodiments, the liner 114 may be formed to have a thickness of about 2 nm to about 15 nm.

Figure 6A:
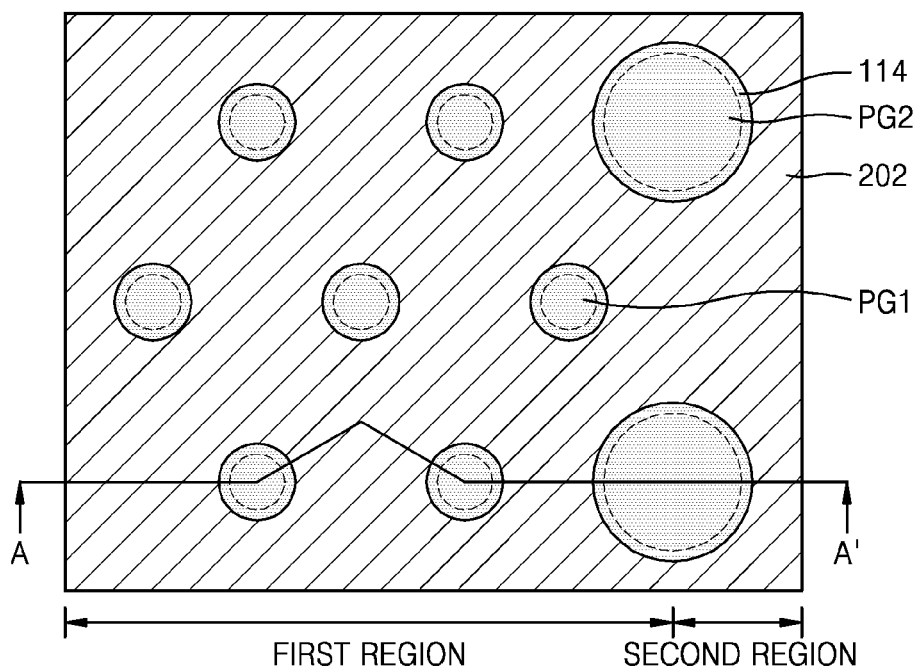
Figure 6B:
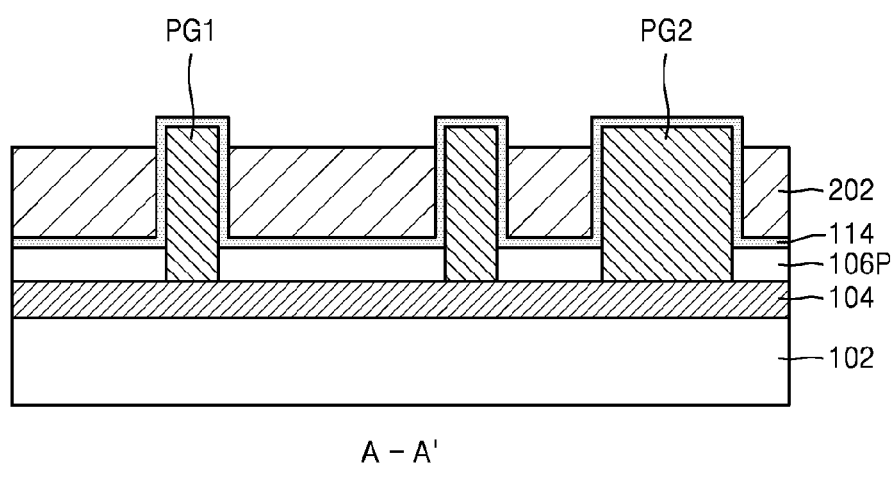

Referring to FIGS. 6A and 6B, the block copolymer layer 202 may be formed on the first mask pattern 106P covered with the liner 114. The block copolymer layer 202 may include the block copolymer that includes the first and second polymer blocks PB1 and PB2 (see FIG. 12) respectively having a first repeat unit and a second repeat unit around the plurality of first pillar-shaped guides PG1 and the plurality of second pillar-shaped guides PG2.

The block copolymer layer 202 may be spaced apart from the plurality of first pillar-shaped guides PG1 and the plurality of second pillar-shaped guides PG2 in-between the liner 114.

In some non-limiting example embodiments, the block copolymer may include a linear or branched polymer having a molecular weight of about 3,000 g/mol to about 2,000,000 g/mol.

In the block copolymer, the first polymer block may be polymethyl methacrylate (PMMA), polyethylene oxide (PEO), a polylactic acid (PLA), or polyisoprene (PI). The second polymer block may be polystyrene (PS).

In the block copolymer layer 202, the second polymer block may constitute a major block, and the first polymer block may constitute a minor block. In some non-limiting example embodiments, a volume ratio between the first polymer block and the second polymer block of the block copolymer may be in the range of about 20:80 to about 40:60.

In some non-limiting example embodiments, the block copolymer may be applied to the first mask pattern 106P covered with the liner 114 to form the block copolymer layer 202. For example, the block copolymer layer 202 may be formed through a dip coating process, a solution casting process, or a spin-coating process.

Figure 7A:
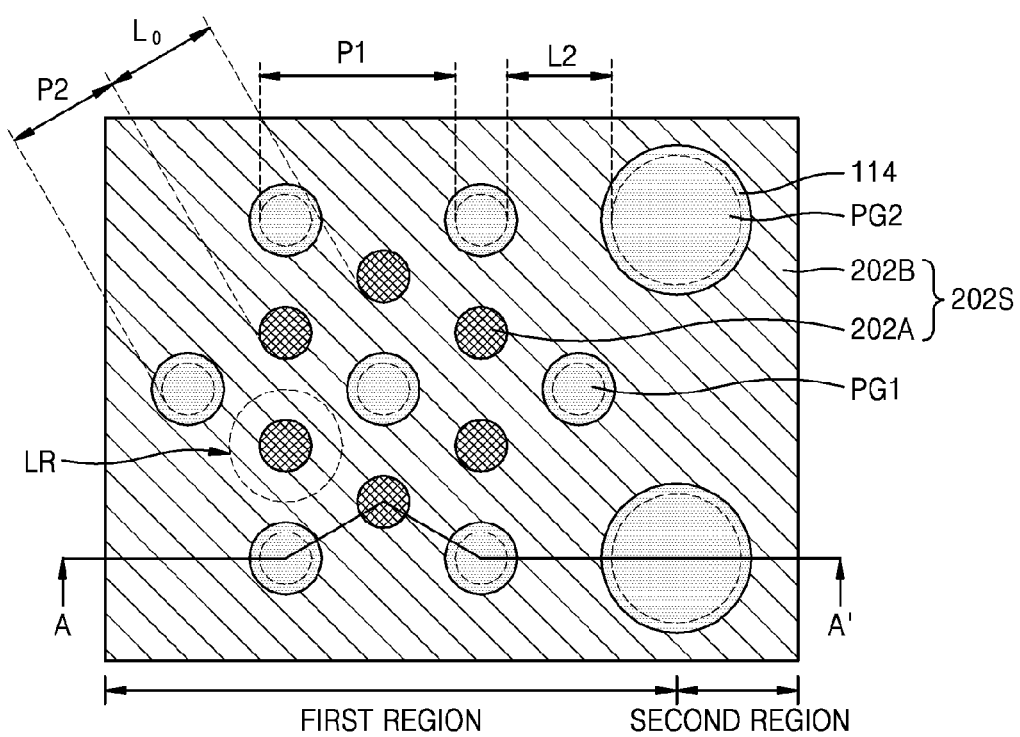
Figure 7B:
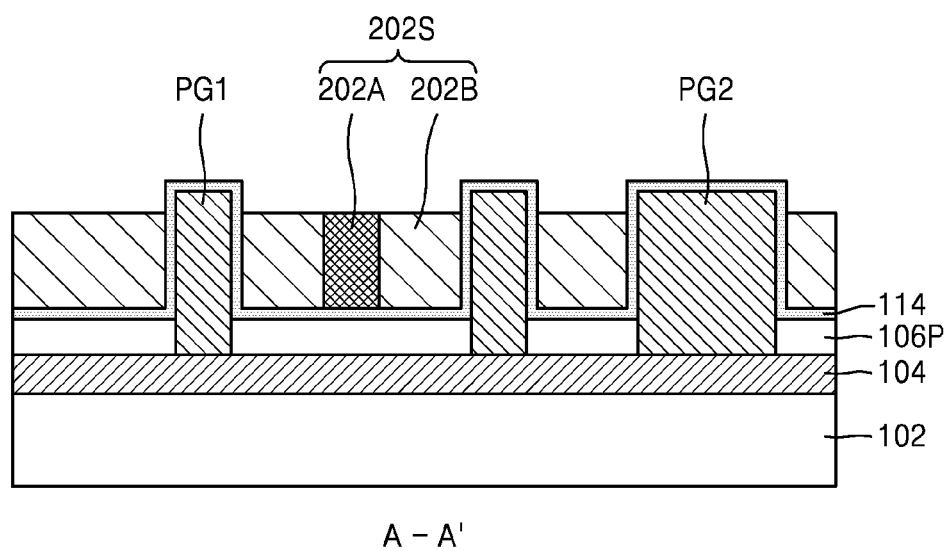

Referring to FIGS. 7A and 7B, a self-assembled layer 202S may be formed by phase-separating the block copolymer layer 202 (see FIGS. 6A and 6B). The self-assembled layer 202S may include a plurality of first domains 202A including the first polymer block and a second domain 202B including the second polymer block. The second domain 202B may surround the plurality of first pillar-shaped guides PG1, the second plurality of pillar-shaped guides PG2, and the plurality of first domains 202A.

In order to phase-separate the block copolymer layer 202, the block copolymer layer 202 may be annealed at a temperature higher than a glass transition temperature (Tg) of the block copolymer included in the block copolymer layer 202. For example, the block copolymer layer 202 may be annealed at a temperature of about 130° C. to about 190° C. for about 1 hour to about 24 hours to phase-separate the block copolymer layer 202.

The plurality of first domains 202A may be regularly arranged together with the plurality of first pillar-shaped guides PG1. For example, a hexagonal array having a second pitch P2 less than the first pitch P1 may be obtained by the plurality of first domains 202A and the first plurality of pillar-shaped guides PG1.

The block copolymer layer 202 may be formed on the liner 114, in which affinity for the first polymer block PB1 (see FIG. 12) is similar to affinity for the second polymer block PB2 (see FIG. 12) on the first mask pattern 106P. Accordingly, vertical orientation properties of the first domains 202A may be improved at the time of phase-separating the block copolymer layer 202.

However, the first domains 202A may not be formed at the boundary between the first region and the second region, that is, between the plurality of first pillar-shaped guides PG1 and the plurality of second pillar-shaped guides PG2. As described above, this is associated with a free energy reduction due to the self-aligning of the block copolymer.

When an annealing process is performed on the block copolymer, the block copolymer has a lower free energy in a state that the block copolymer is self-assembled into the first domains 220A and the second domain 202B through phase-separating than in a state that the first polymer block is mixed with the second polymer block. That is, the phase-separating is performed to maintain a more stable energy state. The block copolymer has a specific bulk cycle $L_0$ according to constituents thereof. When the block copolymer is self-assembled in the region capable of securing the bulk cycle $L_0$, the free energy may be reduced. However, as the width of the plurality of second pillar-shaped guides PG2 increases, the shortest distance L2 between the plurality of first pillar-shaped guides PG1 and the plurality of second pillar-shaped guides PG2 decreases. Therefore, when the first domain 202A is not formed through self-assembling at the boundary between the first region and the second region, the block copolymer may have a more stable state in terms of energy.

In addition, the liner 114 may include the neutral liner in which affinity for the first polymer block PB1 (see FIG. 12) is similar to affinity for the second polymer block PB2 (see FIG. 12), thereby minimizing a free energy increase or decrease caused by the liner 114.

The distance between the plurality of first pillar-shaped guides PG1 and the plurality of second pillar-shaped guides PG2 may be adjusted so as not to form the first domain 202A at the boundary between the first region and the second region, thereby it is possible to secure a trim process margin for distinguishing the boundary between the first region and the second region.

As described above, the first region may be the cell region and the second region may be the peripheral circuit region. It may be necessary that the cell region has holes formed at a regular interval to divide cells, but it may not be necessary that the peripheral circuit region has holes having fine pitches like the cell region. Therefore, it is necessary to suppress the formation of the first domains 202A so as to secure the trim process margin for separating the cell region and the peripheral circuit region.

According to a non-limiting example embodiment of the inventive concepts, the shortest distance L2 between the plurality of first pillar-shaped guides PG1 and the plurality of second pillar-shaped guides PG2 may be less than the bulk cycle $L_0$ of the block copolymer, and thus, it is possible to suppress the formation of the first domains 202A.

As illustrated in FIGS. 7A and 7B, the plurality of first domains 202A are self-assembled in a cylinder shape at the center of a triangle defined by the three adjacent first pillar-shaped guides PG1 among the plurality of first pillar-shaped guides PG1. Although not illustrated for convenience of description, the plurality of first domains 202A may be formed in other portions of the first region.

FIG. 12 is a plan view of the plurality of first domains 202A and the second domain 202B surrounding the plurality of first domains 202A included in the self-assembled layer 202S illustrated in FIGS. 7A and 7B.

FIG. 12 illustrates a combination structure of the first polymer block PB1 constituting the plurality of first domains 202A and the second polymer block PB2 constituting the second domain 202B in the self-assembled layer 202S. The bulk cycle $L_0$ may be determined by the combination structure of the first polymer block PB1 and the second polymer block PB2. That is, the bulk cycle $L_0$ may correspond to a specific pitch of a repeat unit obtained by the self-assembling from the block copolymer layer 202. The bulk cycle $L_0$ may be in the range of about 40 nm to about 60 nm.

In some non-limiting example embodiments, as illustrated in FIGS. 7A and 7B, the first plurality of pillar-shaped guides PG1 may be arranged in a hexagonal array having the first pitch P1 that is at least 1.5 times greater than the hulk cycle $L_0$ of the block copolymer layer 202 at the time of forming the plurality of first pillar-shaped guides PG1 described with reference to FIGS. 3A and 3B such that the plurality of first domains 202A are self-assembled in a cylinder shape at the center of the triangle defined by the three adjacent first pillar-shaped guides PG1 among the plurality of first pillar-shaped guides PG1.

Figure 13:
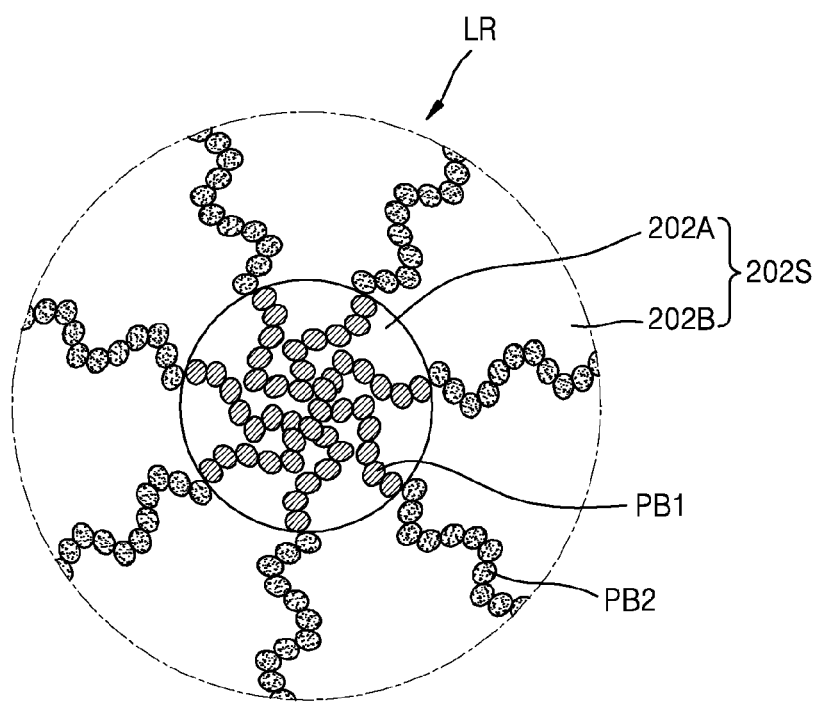
FIG. 13 is a diagram of a self-assembled structure of polymers included in a self-assembled layer formed by a method of forming fine patterns, according to a non-limiting example embodiment of the inventive concepts.

FIG. 13 is a view of a self-assembled structure of polymers included in a local region LR indicated by a dashed circle among the self-assembled layer 202S formed by a phase-separating process described with reference to FIGS. 7A and 7B.

As illustrated in FIG. 13, the first polymer block PB1 is included in the first domains 202A and the second polymer block PB2 is included in the second domain 202B surrounding the first domains 202A. In some non-limiting example embodiments, the first polymer block PB1 may include PMMA, PEO, PLA, or PI, and the second polymer block PB2 may include PS.

Figure 8A:
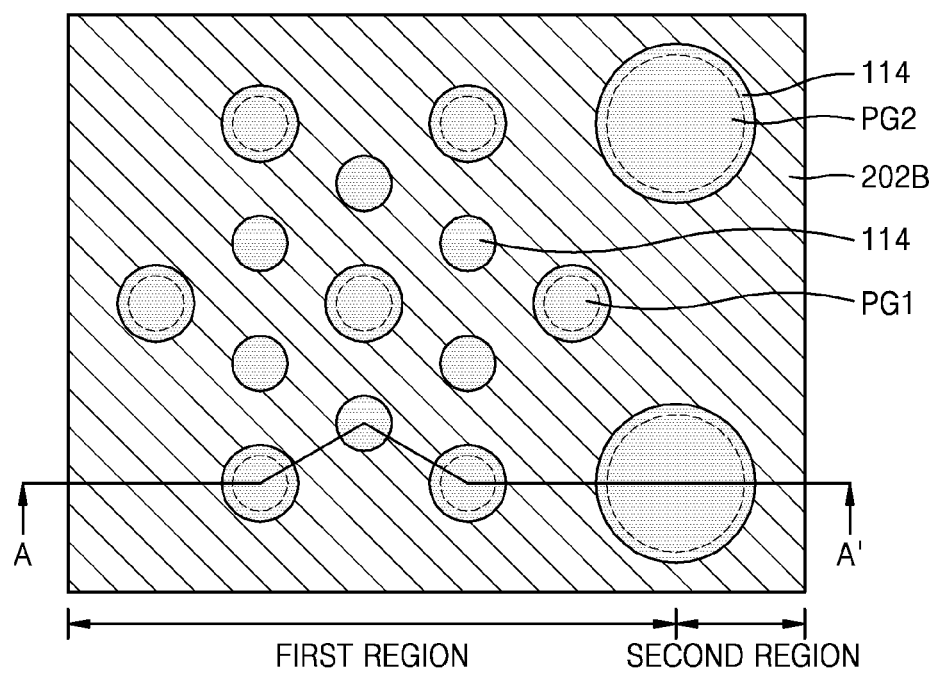
Figure 8B:
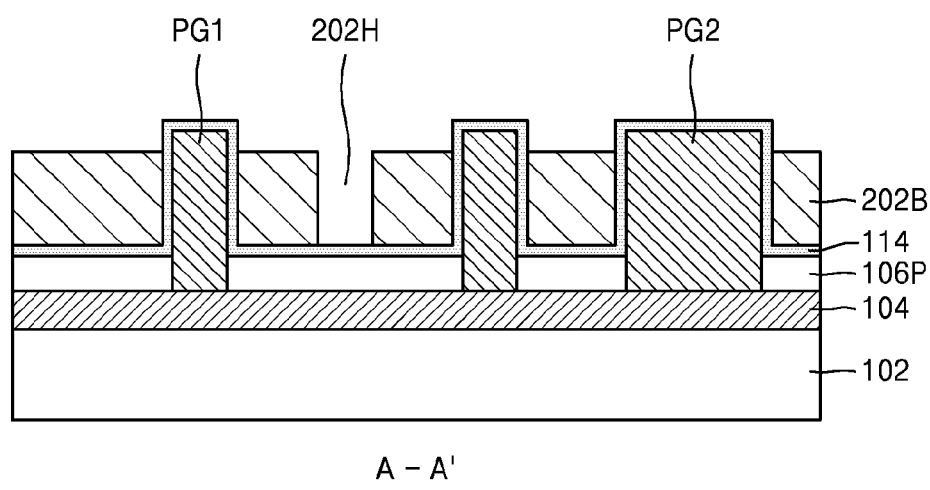

Referring to FIGS. 8A and 8B, the plurality of first domains 202A may be removed from the self-assembled layer 202S (see FIGS. 7A and 7B).

In some non-limiting example embodiments, in order to selectively remove only the plurality of first domains 202A from the self-assembled layer 202S, after the plurality of first domains 202A are selectively resolved by applying a polymer decomposer to the self-assembled layer 202S, the plurality of resolved first domains 202A may be stripped by using a washing solution, for example, isopropyl alcohol (IPA). In some non-limiting example embodiments, radiant rays or plasma may be used as the polymer decomposer. The radiant rays may be irradiated under an oxygen environment and may include deep ultraviolet (DUV) radiation, a soft X-ray, or an E-beam. The plasma may be oxygen plasma. Kinds of the polymer decomposer or energies may be selected to selectively decompose the plurality of first domains 202A. For example, the plurality of first domains 202A and the second domain 202B may have different threshold energies allowing the decomposition to start. Accordingly, the radiant rays or the plasma, which has energy capable of selectively decomposing only the plurality of first domains 202A of the plurality of first domains 202A and the plurality of second domain 202B, may be applied to the self-assembled layer 202S. The radiant ray energy or the plasma energy may be adjusted by a radiant ray irradiating time or a plasma exposing time.

Figure 9A:
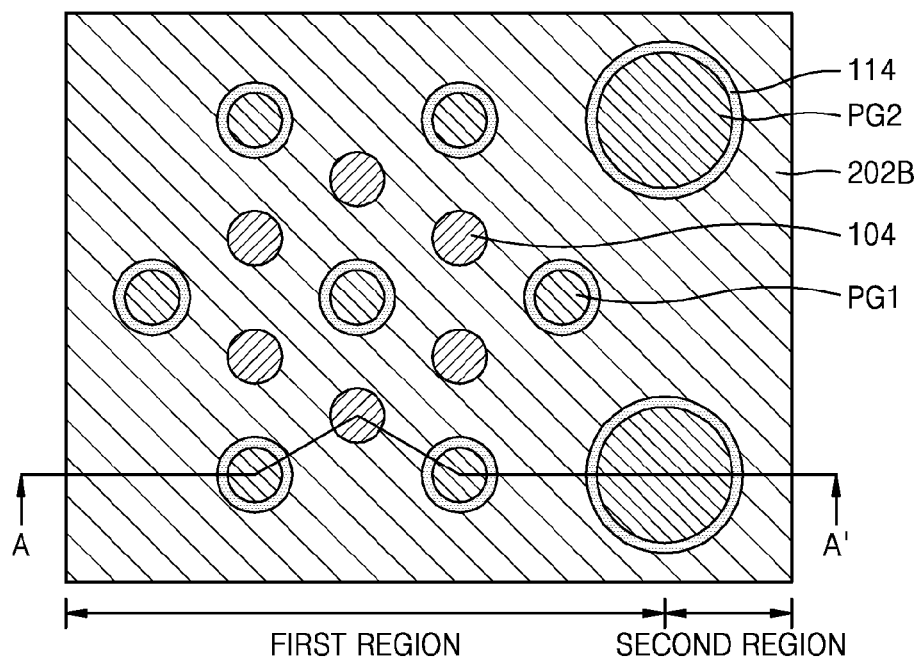
Figure 9B:
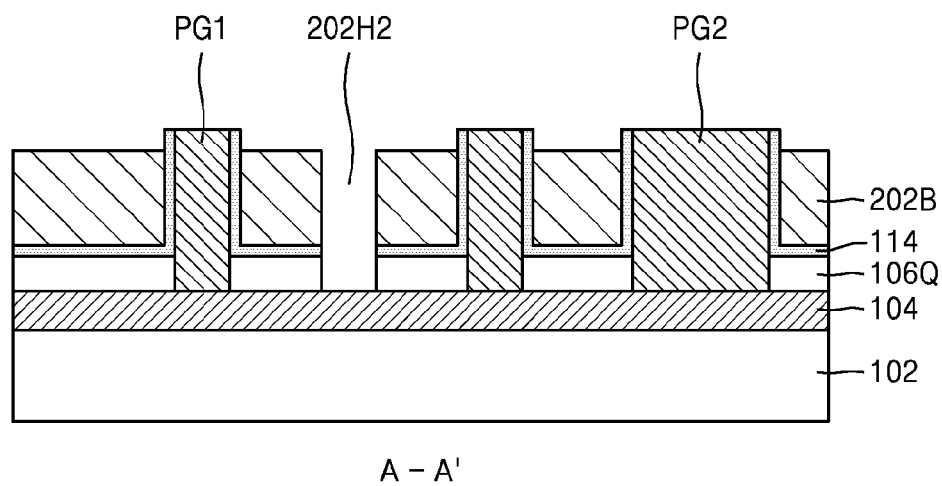

Referring to FIGS. 9A and 9B, a first mask pattern 106Q may be formed on the first mask pattern 106P by etching the exposed liner 114 and the first mask pattern 106P (see FIGS. 8A and 8B) by using the plurality of first pillar-shaped guides PG1, the plurality of second pillar-shaped guides PG2, and the second domain 202B as an etch mask. The first mask pattern 106Q may have a plurality of self-assembled holes 202H2 corresponding to alignment shapes of the plurality of first domains 202A.

Figure 10A:
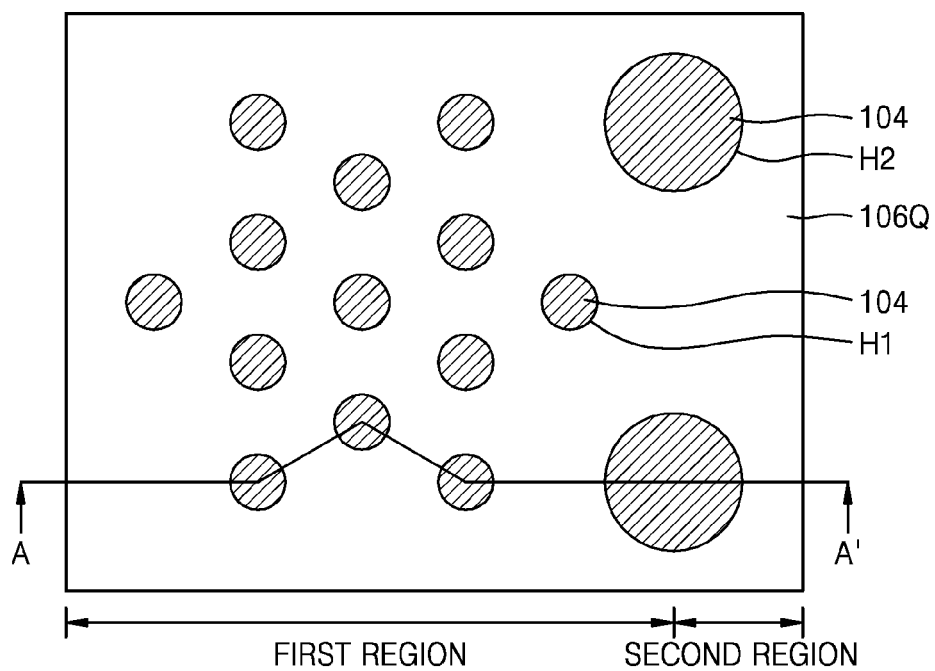
Figure 10B:
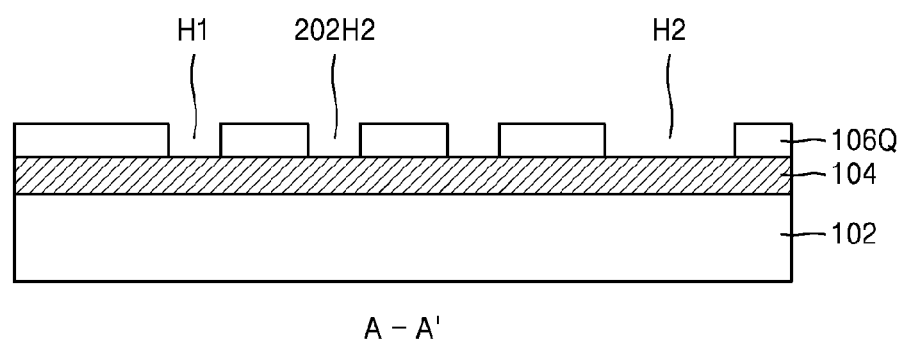

Referring FIGS. 10A and 10B, an upper surface of the mask pattern 106Q may be exposed by removing the plurality of first pillar-shaped guides PG1, the plurality of second pillar-shaped guides PG2, and the second domain 202B, which remain on the first mask pattern 106Q.

The etching target film 104 may be exposed through the plurality of guide-forming holes H1, the plurality of second guide-forming holes H2, and the plurality of self-assembled holes 202H2, which are formed in the first mask pattern 106P.

Figure 11A:
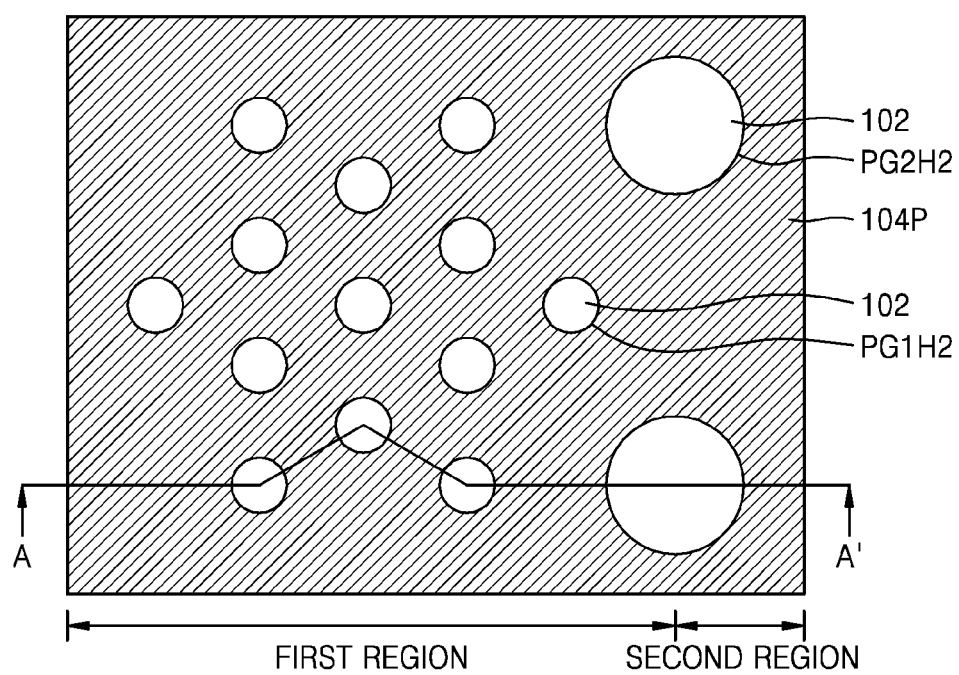
Figure 11B:
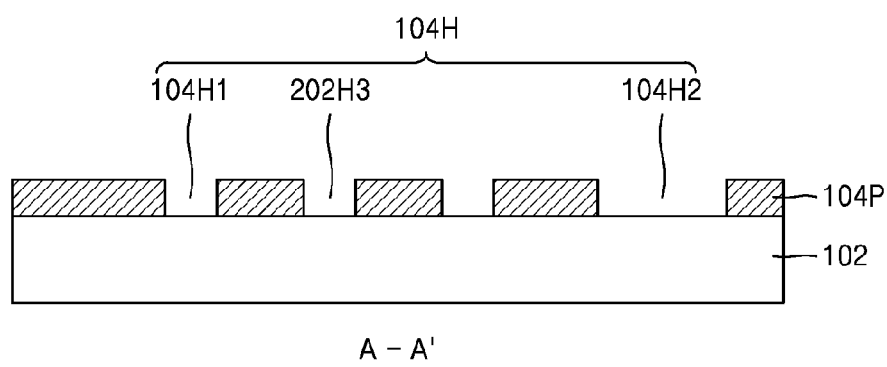

Referring to FIGS. 11A and 11B, a fine pattern 104P having a plurality of holes 104H including 104H1, 104H2, and 202H3 may be formed by etching the portions among the etching target film 104 exposed through the plurality of first guide-forming holes H1, the plurality of second guide-forming holes H2, and the plurality of self-assembled holes 202H2 by using the first mask pattern 106Q (sec FIGS. 10A and 10B) as an etch mask.

Unnecessary films remaining on the fine pattern 104P may be removed to expose an upper surface of the fine pattern 104P.

According to the non-limiting example method of forming fine patterns described with reference to FIGS. 1A to 11B, in forming fine patterns exceeding the resolution limitations of a photolithography process by using the block copolymer, the non-limiting example method may represent a method of securing a process margin for discriminating the boundary between the cell region and the peripheral circuit region by adjusting the width of the pillar-shaped guides according to aligned positions of the pillar-shaped guides.

Referring to the boundary between the first region and the second region of FIG. 11A, it may be seen that the interval between the fine patterns is wider compared to the other portions. When a trim process is performed on this region, it is possible to reduce the difficulty in the process of distinguishing the boundary between the first region and the second region.

FIGS. 14A to 14M are cross-sectional views of a method of forming fine patterns, according to another non-limiting example embodiment of the inventive concepts.

The method of forming the fine patterns will be described with reference to FIGS. 14A to 14M. The method includes a process of forming pillar-shaped guides having a different structure from the first pillar-shaped guides PG1 and the second pillar-shaped guide PG2 illustrated in FIGS. 1A to 11B. The like reference numerals as FIGS. 1A to 11B denote the same elements throughout FIGS. 14A to 14B and detailed descriptions thereof are omitted for convenience of description.

Figure 14A:
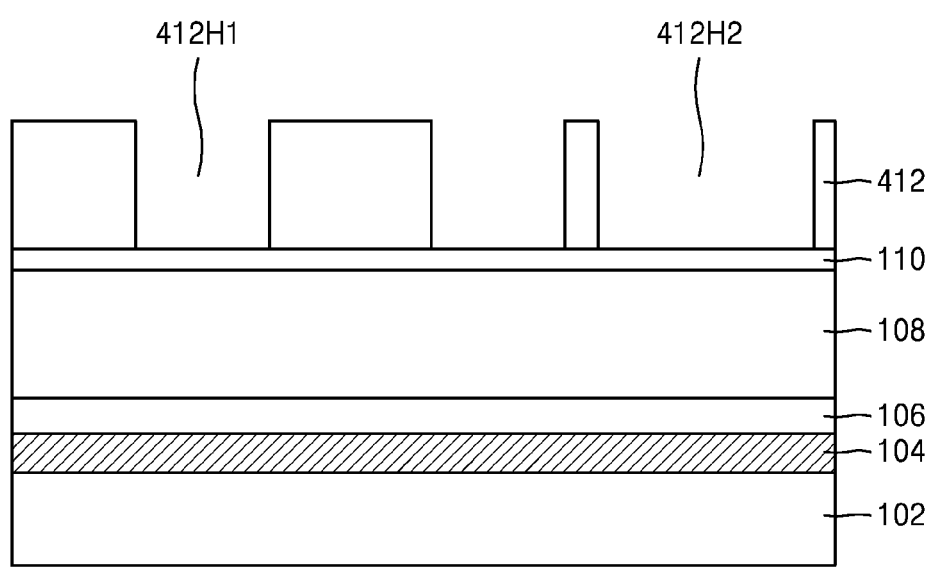
FIGS. 14A to 14M are cross-sectional views for describing a method of forming fine patterns, according to another non-limiting example embodiment of the inventive concepts.

Referring to FIG. 14A, in a similar manner as described above with reference to FIGS. 1A and 1B, an etching target film 104 may be formed on a substrate 102, and a first mask layer 106, a second mask layer 108, and an anti-reflection film 110 may be sequentially formed on the etching target film 104.

A third mask pattern 412 having a plurality of first holes 412H1 and a plurality of second holes 412H2 may be formed on the anti-reflection film 110.

The third mask pattern 412 is approximately the same as the third mask pattern 112 described with reference to FIGS. 1A and 1B.

Figure 14B:
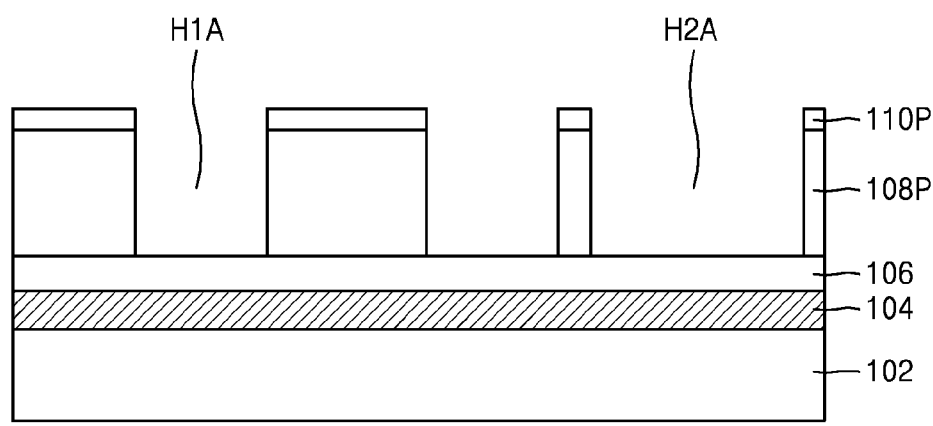

Referring to FIG. 14B, a second mask pattern 108P and an anti-reflection pattern 110P may be formed by etching the anti-reflection film 110 and the second mask layer 108 by using the third mask pattern 412 (see FIGS. 1A and 1B) as an etch mask, thereby forming a plurality of first guide-forming holes H1A and a plurality of second guide-forming holes H2A passing through the second mask pattern 108P.

After the plurality of first guide-forming holes H1A and the plurality of second guide-forming holes H2A are formed, the third mask pattern 412 (see FIG. 14A) may be removed.

Figure 14C:
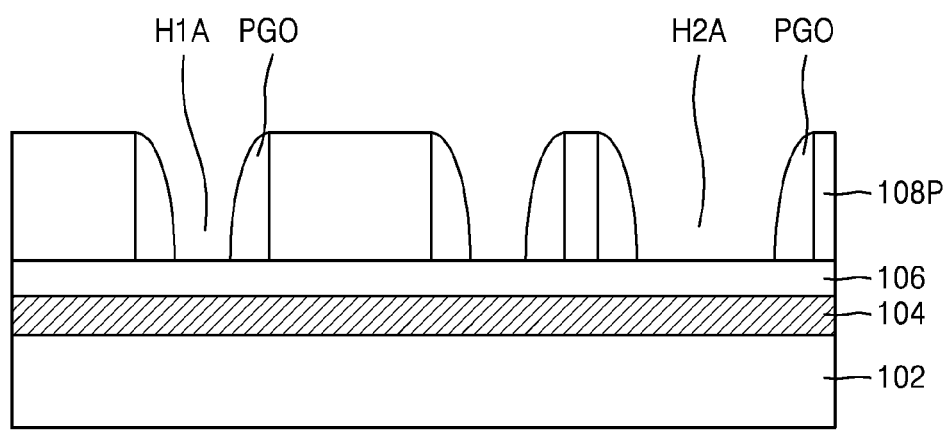

Referring to FIG. 14C, a plurality of pillar-shaped guide outer walls PGO may be formed to cover sidewalls of the second mask pattern 108P in the plurality of first guide-forming holes H1A and the plurality of second guide-forming holes H2A.

In some non-limiting example embodiments, in order to form the pillar-shaped guide outer walls PGO, after a first material layer is formed to cover inner walls of the plurality of first guide-forming holes H1A and the plurality of second guide-forming holes H2A and an upper portion of the second mask pattern 108P in the result of FIG. 14B, the first material layer may be etched back to allow the plurality of pillar-shaped guide outer walls PGO to remain on only the sidewalls of the second mask pattern 108P in the plurality of first guide-forming holes H1A and the plurality of second guide-forming holes H2A. The etching back of the first material layer may be performed until an upper surface of the second mask pattern 108P is exposed. In the etching back, the anti-reflection pattern 110P remaining on the second mask pattern 108P may be removed.

In some non-limiting example embodiments, the plurality of pillar-shaped guide outer walls PGO may include a Si-containing material, for example, silicon oxide.

Figure 14D:
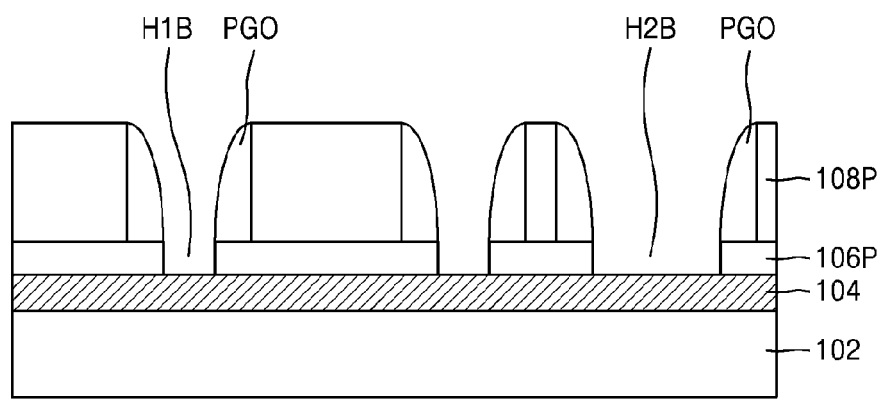

Referring to FIG. 14D, a first mask pattern 106P having a plurality of first holes H1B and a plurality of second holes H2B may be formed by etching the first mask layer 106 exposed through the plurality of first guide-forming holes H1A and the plurality of second guide-forming holes H2A (see FIG. 14C) by using the second mask pattern 108P and the plurality of pillar-shaped guide outer walls PGO as an etch mask.

The plurality of first guide-forming holes H1A, the plurality of second guide-forming holes H2A, the plurality of first holes H1B, and the plurality of second holes H2B may provide a plurality of inner spaces for forming a plurality of first pillar cores PGC1 and a plurality of second pillar cores PGC2 to be described below with reference to FIG. 14E.

Figure 14E:
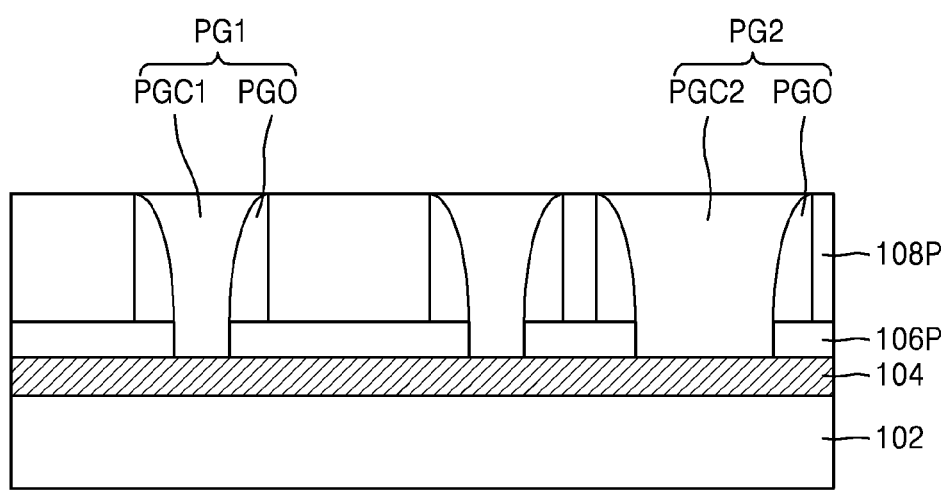

Referring to FIG. 14E, a plurality of first pillar cores PGC1 and a plurality of second pillar cores PGC2 may be formed to fill the plurality of first guide-forming holes H1A, the plurality of second guide-forming holes H2A, the plurality of first holes H1B, and the plurality of second holes H2B (see FIG. 14D) to thereby form a plurality of first pillar-shaped guides PG1 including the plurality of first pillar cores PGC1 and the plurality of pillar-shaped guide outer walls PGO and to form a plurality of second pillar-shaped guides PG2 including a plurality of second pillar cores PGC2 and the plurality of pillar-shaped guide outer walls PGO.

In some non-limiting example embodiments, in order to form the plurality of first pillar cores PGC1 and the plurality of second pillar cores PGC2, after a second material layer is formed on the substrate 102 at a thickness enough to fill the plurality of first guide-forming holes H1A, the plurality of second guide-forming holes H2A, the plurality of first holes H1B, and the plurality of second holes H2B, the plurality of first pillar cores PGC1 and the plurality of second pillar cores PGC2 may remain by etching back or flattening the second material layer.

The plurality of first pillar cores PGC1 and the plurality of second pillar cores PGC2 may include a Si-containing material, for example, silicon oxide. In some non-limiting example embodiments, the first pillar cores PGC1, the plurality of first pillar cores PGC1, the plurality of second pillar cores PGC2, and the plurality of pillar-shaped guide outer walls PGO may include the same material.

In some non-limiting example embodiments, the plurality of first pillar-shaped guides PG1 may be arranged in a hexagonal array having a pitch that is about 1.73 times greater than the bulk cycle $L_0$ of the block copolymer layer 202. In a similar manner as described with reference to FIGS. 9A and 9B, a plurality of first domains 202A formed by phase-separating the block copolymer layer 202 may be self-assembled in a cylinder shape at a center between three adjacent first pillar-shaped guides PG1 among the plurality of first pillar-shaped guides PG1.

Figure 14F:
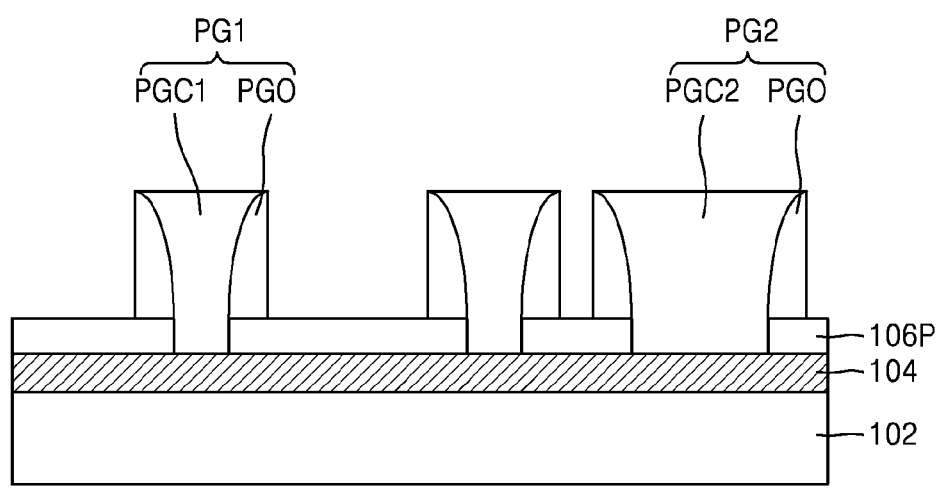

Referring to FIG. 14F, the second mask pattern 108P (see FIG. 14E) may be removed to expose upper surfaces and sidewalls of the plurality of first pillar-shaped guides PG1 and the plurality of second pillar-shaped guides PG2.

Figure 14G:
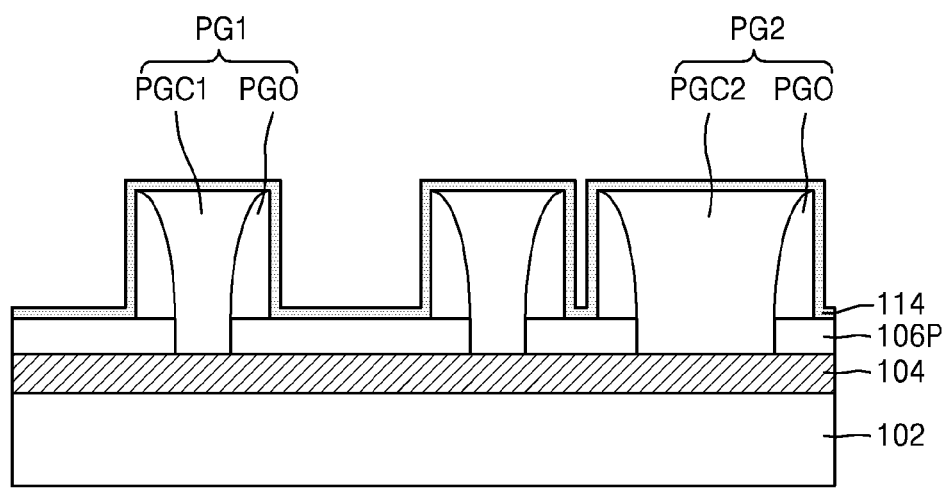

Referring to FIG. 14G, in the same manner of forming the liner 114 described with reference to FIGS. 5A and 5B, a liner 114 may be formed to cover the exposed upper surface of the first mask pattern 106P and the exposed upper surfaces and sidewalls of the first plurality of pillar-shaped guides PG1 and the plurality of second pillar-shaped guides PG2.

In some non-limiting example embodiments, the liner 114 is substantially the same as the liner 114 described with reference with FIGS. 5A and 5B.

Figure 14H:
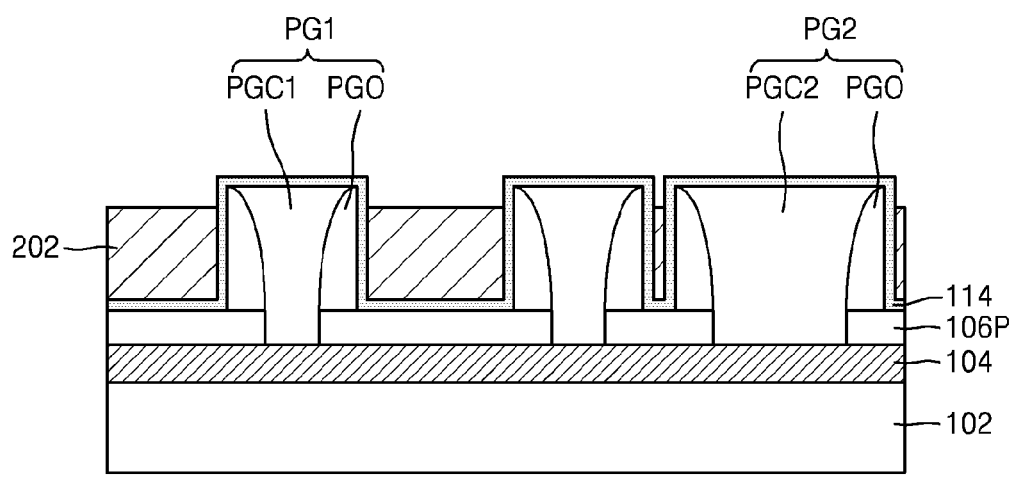

Referring to FIG. 14H, in a similar manner as described with reference to FIGS. 6A and 6B, the block copolymer layer 202 may be formed on the first mask pattern 106P covered with the liner 114. The block copolymer layer 202 may include the block copolymer that includes the first and second polymer blocks respectively having the first repeat unit and the second repeat unit around the plurality of first pillar-shaped guides PG1 and the plurality of second pillar-shaped guides PG2.

Figure 14I:
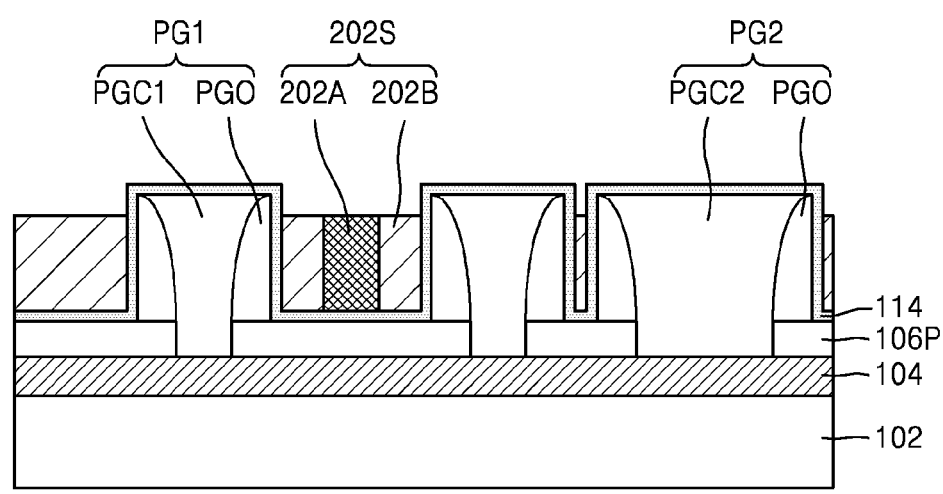

Referring to FIG. 14I, in the same manner as described with reference to FIGS. 7A and 7B, a self-assembled layer 202S may be formed by phase-separating the block copolymer layer 202. The self-assembled layer 202S may include a plurality of first domains 202A including the first polymer block and a second domain 202B including the second polymer block. The second domain 202B may surround the plurality of first pillar-shaped guides PG1, the second plurality of pillar-shaped guides PG2, and the plurality of first domains 202A.

Figure 14J:
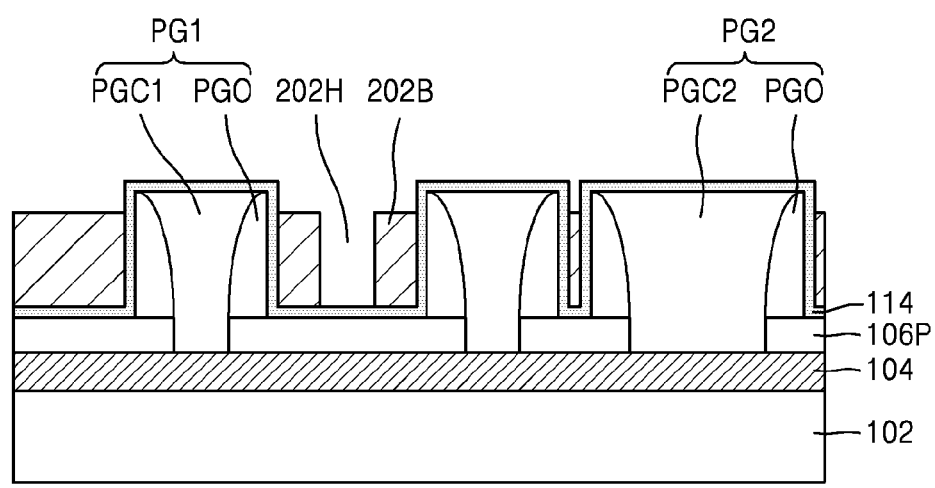

Referring to FIG. 14J, the plurality of first domains 202A may be removed from the self-assembled layer 202S (see FIG. 14I).

Figure 14K:
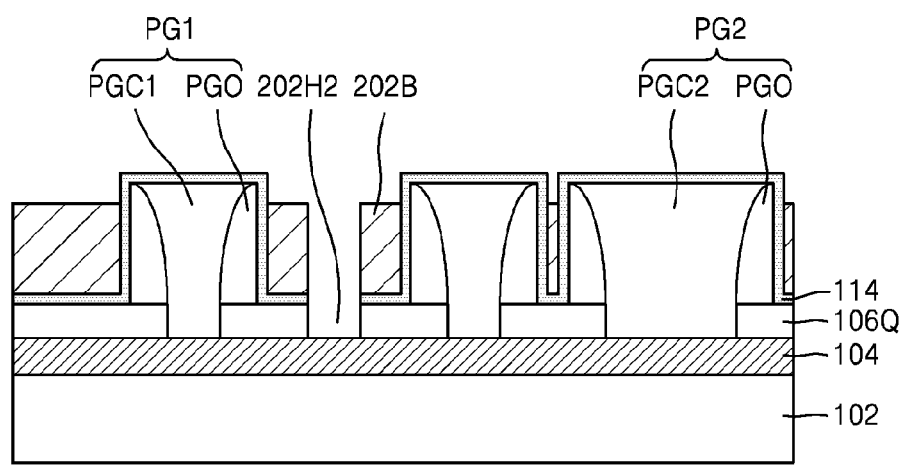

Referring to FIG. 14K, in the same manner as described with reference to FIGS. 9A and 9B, a first mask pattern 106Q having a plurality of self-assembled holes 202H2 may be formed on the first mask pattern 106P by etching the exposed liner 114 and first mask pattern 106P (of FIG. 14C) by using the plurality of first pillar-shaped guides PG1, the plurality of second pillar-shaped guides PG2, and the second domain 202B as an etch mask. The plurality of self-assembled holes 202H2 may have shapes corresponding to alignment shapes of a plurality of holes 202H (see FIG. 14J) formed by removing the plurality of first domains 202A.

Figure 14L:
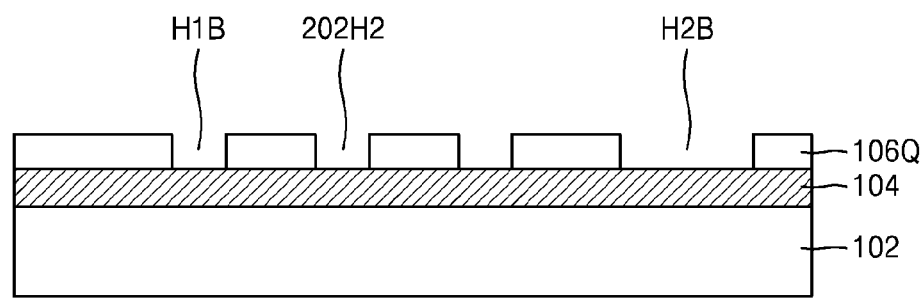

Referring to FIG. 14L, an upper surface of the first mask pattern 106Q may be exposed by removing unnecessary films including the plurality of first pillar-shaped guides PG1, the plurality of second pillar-shaped guides PG2, the second domain 202B, and the liner 114, which remain on a first mask pattern 106Q.

The etching target film 104 may be exposed through the plurality of first guide-forming holes H1B, the plurality of second guide-forming holes H2B, and the plurality of self-assembled holes 202H2, which are formed in the first mask pattern 106Q.

Figure 14M:
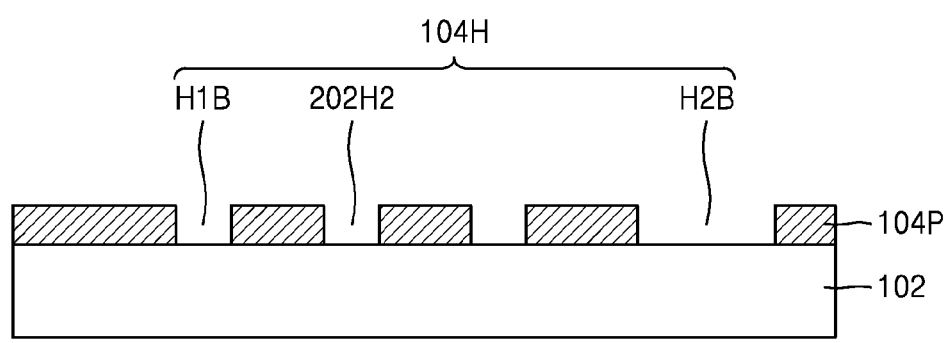

Referring to FIG. 14M, a fine pattern 104P having a plurality of holes 104H may be formed by etching portions of the etching target film 104 exposed through the plurality of first guide-forming holes H1B, the plurality of second guide-forming holes H2B, and the plurality of third self-assembled holes 202H2 by using the first mask pattern 106Q (see FIG. 14L) as an etch mask.

An upper surface of the fine pattern 104P may be exposed by removing unnecessary films remaining on the fine pattern 104P.

Figure 15:
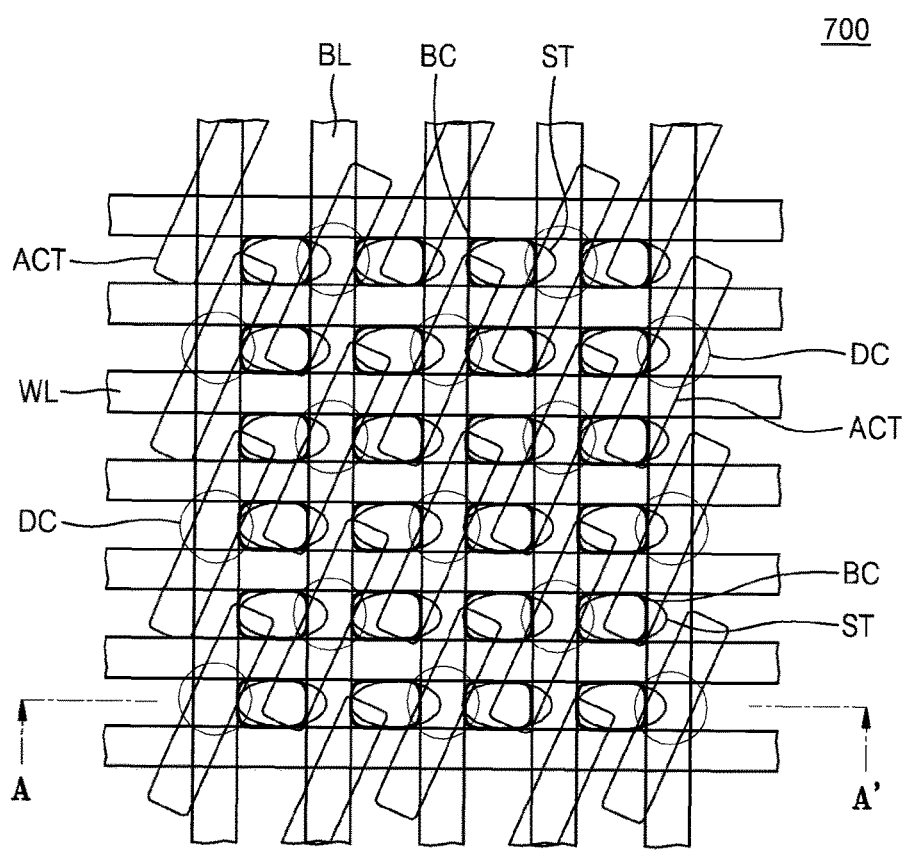
FIG. 15 is a plan layout of an integrated circuit device that is implementable by a method of forming fine patterns, according to another non-limiting example embodiment of the inventive concepts.
Figure 15:
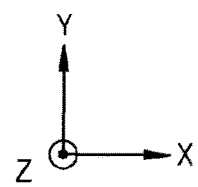

FIG. 15 is a plan layout of an integrated circuit device 700 implementable by a method of forming fine patterns, according to a non-limiting example embodiment of the inventive concepts. A memory cell array region of a semiconductor memory device may be configured by the layout illustrated in FIG. 15.

Referring to FIG. 15, a memory cell array region of the integrated circuit device 700 may include a plurality of active regions ACT. A plurality of word lines WL may extend in parallel to each other in a first direction (X-direction) across the plurality of active regions ACT. The plurality of word lines WL may be arranged at the same interval. A plurality of bit lines BL may extend in parallel to each other in a second direction (Y direction) perpendicular to the first direction above the plurality of word lines WL.

The plurality of bit lines BL may be connected to the plurality of active regions ACT through a plurality of direct contacts DC.

A plurality of buried contacts BC may have a contact structure that extends from a region between two adjacent bit lines BL among the plurality of bit lines BL to an upper portion of any one of the two adjacent bit lines BL. In some non-limiting example embodiments, the plurality of buried contacts BC may be arranged in rows in the first direction (X direction) and in columns in a second direction (Y direction). In some non-limiting example embodiments, the plurality of buried contacts BC may be arranged at the same interval in the second direction (Y direction). The plurality of buried contacts BC may function to electrically connect a plurality of lower electrodes ST of capacitors to the plurality of active regions ACT.

The method of forming the patterns according to non-limiting example embodiments described with reference to FIGS. 1A to 14M may be applied to form unit elements illustrated in FIG. 15, for example, the plurality of active regions ACT, the plurality of word lines WL, the plurality of bit lines BL, the plurality of direct contacts DC, the plurality of buried contacts BC, and the plurality of lower electrodes ST.

Figure 16:
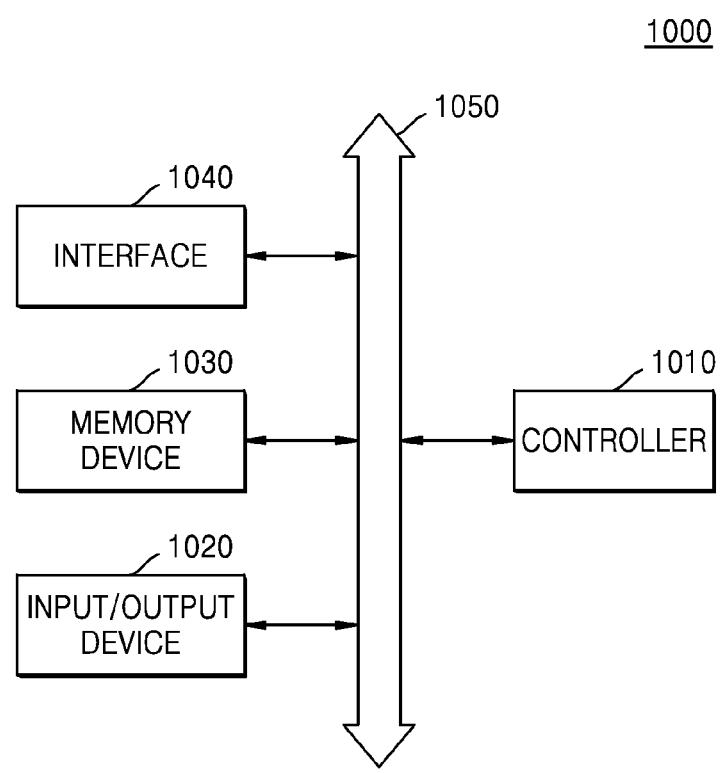
FIG. 16 is a block diagram of a system including an integrated circuit device manufactured by a method of forming fine patterns, according to another non-limiting example embodiment of the inventive concepts.

FIG. 16 is a block diagram of a system 1000 including an integrated circuit device manufactured by a method of forming fine patterns, according to a non-limiting example embodiment of the inventive concepts.

The system 1000 may include a controller 1010, an input/output device 1020, a memory device 1030, and an interface 1040. The system 1000 may be a mobile system or a system transmitting or receiving information. In some non-limiting example embodiments, the mobile system may include, but not limited to, a personal digital assistant (PDA), a portable computer, a web tablet, a wireless phone, a mobile phone, a digital music player, or a memory card. The controller 1010 may include, but not limited to, a microprocessor, a digital signal processor, a microcontroller, or a similar device to control an executing program in the system 1000. The input/output device 1020 may be used to input or output data of the system 1000. The system 1000 may be connected to an external device including but not limited to, for example, a personal computer or a network by using the input/output device 1020, and may exchange data with the external device. The input/output device 1020 may be including but not limited to, for example, a keypad, a keyboard, or a display.

The memory device 1030 may store codes and/or data for operating the controller 1010 or may store data processed by the controller 1010. The memory device 1030 may include at least one integrated circuit device manufactured by the method of forming the patterns, according to non-limiting example embodiments of the inventive concepts. For example, the memory device 1030 may include at least one integrated circuit device manufactured by any one of the methods of forming the fine patterns, described with reference to FIGS. 1A to 14M.

The interface 1040 may be a data transmission path between the system 1000 and other external devices. The controller 1010, the input/output device 1020, the memory device 1030, and the interface 1040 may communicate with each other through a bus 1050. The system 1000 may be used in a mobile phone, an MP3 player, a navigation device, a portable multimedia player (PMP), a solid state disk (SSD), or household appliances.

Figure 17:
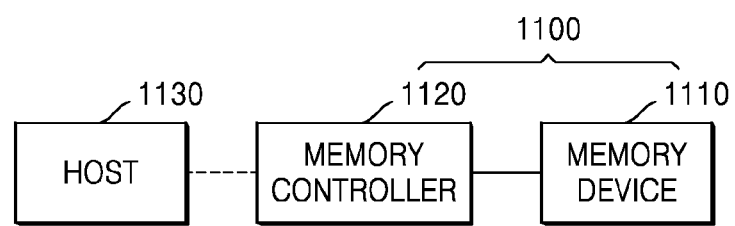
FIG. 17 is a block diagram of a memory card including an integrated circuit device manufactured by a method of forming fine patterns, according to another non-limiting example embodiment of the inventive concepts.

FIG. 17 is a block diagram of a memory card 1100 including an integrated circuit device manufactured by a method of forming fine patterns, according to a non-limiting example embodiment of the inventive concepts.

The memory card 1100 may include a memory device 1110 and a memory controller 1120.

The memory device 1110 may store data. In some non-limiting example embodiments, the memory device 1110 may have non-volatile characteristics to maintain the stored data even when a power supply thereto is cut off. The memory device 1110 may include at least one integrated circuit device manufactured by the method of forming the patterns, according to non-limiting example embodiments of the inventive concepts. For example, the memory device 1110 may include at least one integrated circuit device manufactured by any one of the methods of forming fine patterns described with reference to FIGS. 1A to 14M.

The memory controller 1120 may read out data stored in the memory device 1110 or may store data in the memory device 1110, in response to a reading/writing request of a host 1130. The memory controller 1120 may include at least one integrated circuit device manufactured by methods according to non-limiting example embodiments of the inventive concepts. For example, the memory controller 1120 may include at least one integrated circuit device manufactured by any one of the methods of forming the fine patterns described with reference to FIGS. 1A to 14M.

While the inventive concepts have been particularly shown and described with reference to non-limiting example embodiments thereof, it will be understood by those of ordinary skill in the art that various changes in forms and details may be made therein without departing from the spirit and scope of the inventive concepts as defined by the following claims.

What is claimed is:

1. A method of forming fine patterns, the method comprising:
   forming a feature layer on a substrate, the substrate having a first region and a second region;
   forming a plurality of first pillar-shaped guides and a plurality of second pillar-shaped guides, the plurality of second pillar-shaped guides having a diameter greater than a diameter of the plurality of first pillar-shaped guides, the plurality of first pillar-shaped guides being regularly arranged on the feature layer of the first region of the substrate, and the plurality of second pillar-shaped guides being arranged on the feature layer at a boundary between the first region and the second region;

forming a liner on surfaces of the feature layer, the plurality of first pillar-shaped guides, and the plurality of second pillar-shaped guides;

forming a block copolymer layer on the liner such that the block copolymer layer is formed around each of the plurality of first pillar-shaped guides and the plurality of second pillar-shaped guides;

forming a plurality of first domains and a second domain by phase-separating the block copolymer layer, the plurality of first domains being regularly arranged together with the plurality of first pillar-shaped guides, and the second domain surrounding each of the plurality of first domains;

removing the plurality of first domains; and forming a plurality of holes in the feature layer by etching the liner and the feature layer using the plurality of first pillar-shaped guides, the plurality of second pillar-shaped guides, and the second domain as an etch mask, wherein the liner includes a neutral liner.

2. The method of claim 1, wherein a shortest distance between one of the plurality of first pillar-shaped guides and an adjacent one of the plurality of second pillar-shaped guides is shorter than a bulk cycle ($L_0$) of the block copolymer layer, and the bulk cycle ($L_0$) of the block copolymer layer is in a range of about 40 nanometers (nm) to about 60 nanometers (nm).

3. The method of claim 1, wherein the plurality of first pillar-shaped guides are arranged in a hexagonal array, the hexagonal array having a first pitch that is about 1.73 times greater than a bulk cycle ($L_0$) of the block copolymer layer, and the bulk cycle ($L_0$) of the block copolymer layer is in a range of about 40 nm to about 60 nm.

4. The method of claim 1, wherein a shortest distance between one of the plurality of first pillar-shaped guides and an adjacent one of the plurality of first domains is shorter than a shortest distance between one of the plurality of second pillar-shaped guides and an adjacent one of the plurality of first domains.

5. The method of claim 1, wherein a distance between centers of two adjacent first pillar-shaped guides from among the plurality of first pillar-shaped guides is substantially same as a distance between a center of one of the plurality of second pillar-shaped guides and a center of an adjacent first pillar-shaped guide from among the plurality of first pillar-shaped guides.

6. The method of claim 1, wherein
the plurality of first pillar-shaped guides are regularly arranged at a first interval,
the plurality of second pillar-shaped guides and the plurality of first pillar-shaped guides are regularly arranged at a second interval with respect to each other, and
the first interval is greater than the second interval.

7. The method of claim 1, wherein
the plurality of first pillar-shaped guides are regularly arranged to have a first pitch,
each of the plurality of first domains has a cylinder form and is arranged at a center between corresponding two or three first pillar-shaped guides from among the plurality of first pillar-shaped guides by performing the phase-separating, and
the plurality of first pillar-shaped guides and the plurality of first domains are regularly arranged to have a second pitch with respect to each other, and the second pitch is less than the first pitch.

8. The method of claim 1, wherein the forming a plurality of first domains and a second domain includes not forming the plurality of first domains between the plurality of second pillar-shaped guides and adjacent ones of the plurality of first pillar-shaped guides.

9. The method of claim 1, wherein
the first region includes a cell region, and the second region includes a peripheral circuit region.

10. A method of forming fine patterns, the method comprising:

forming a feature layer on a substrate, the substrate having a first region and a second region;

forming a material layer including a plurality of first holes and a plurality of second holes on the feature layer, the plurality of first holes being regularly arranged at a first interval on the first region, and the plurality of second holes being regularly arranged at a second interval at a boundary between the first region and the second region, the second interval being greater than the first interval;

forming a plurality of first pillar-shaped guides and a plurality of second pillar-shaped guides, the plurality of first pillar-shaped guides protruding upward from the feature layer to fill the plurality of first holes, the plurality of second pillar-shaped guides protruding upward from the feature layer to fill the plurality of second holes;

forming a neutral liner on surfaces of the feature layer, the plurality of first pillar-shaped guides, and the plurality of second pillar-shaped guides;

forming a block copolymer layer on the neutral liner such that the block copolymer layer is around each of the plurality of first pillar-shaped guides and the plurality of second pillar-shaped guides;

forming a plurality of first domains and a second domain by phase-separating the block copolymer, the plurality of first domains being regularly arranged together with the plurality of first pillar-shaped guides, and the second domain surrounding each of the plurality of first pillar-shaped guides and the plurality of first domains;

removing the plurality of first domains; and forming a plurality of third holes in the feature layer by etching the neutral liner and the feature layer by using the plurality of first pillar-shaped guides, the plurality of second pillar-shaped guides, and the second domain as an etch mask.

11. The method of claim 10, wherein diameters of the plurality of second holes are greater than diameters of the plurality of first holes and diameters of the plurality of third holes.

12. The method of claim 10, wherein the plurality of third holes are not formed between the plurality of second holes and adjacent ones of the plurality of first holes.

13. The method of claim 10, wherein
a shortest distance between one of the plurality of second holes and an adjacent one of the plurality of first holes is shorter than a shortest distance between the plurality of first holes, and
the shortest distance between the one of the plurality of second holes and the adjacent one of the plurality of first holes is shorter than a shortest distance between one of the plurality of second holes and an adjacent one of the plurality of third holes.

14. The method of claim 10, wherein the plurality of first holes are arranged in a hexagonal array having a first pitch that is about 1.73 times greater than a bulk cycle ($L_0$) of the block copolymer layer, and the bulk cycle ($L_0$) of the block copolymer layer is in a range of about 40 nm to about 60 nm.

* * * * *